United States Patent
Beck et al.

(10) Patent No.: US 9,529,943 B2
(45) Date of Patent: Dec. 27, 2016

(54) SIZING APPLICATION FOR A TOILET BOWL TRAPPING DEVICE

(71) Applicant: Sage Products, LLC, Cary, IL (US)

(72) Inventors: David Beck, Crystal Lake, IL (US); Linda Vrabec, Barrington, IL (US)

(73) Assignee: SAGE PRODUCTS, LLC, Cary, IL (US)

( * ) Notice: Subject to any disclaimer, the term of this patent is extended or adjusted under 35 U.S.C. 154(b) by 283 days.

(21) Appl. No.: 14/264,347

(22) Filed: Apr. 29, 2014

(65) Prior Publication Data

US 2014/0236543 A1    Aug. 21, 2014

Related U.S. Application Data

(63) Continuation-in-part of application No. 13/526,191, filed on Jun. 18, 2012, now Pat. No. 9,157,224, which is a continuation-in-part of application No. 12/533,782, filed on Jul. 31, 2009, now Pat. No. 8,201,281.

(51) Int. Cl.
 *G06F 17/50* (2006.01)
 *E03D 11/00* (2006.01)

(52) U.S. Cl.
 CPC .............. *G06F 17/50* (2013.01); *E03D 11/00* (2013.01)

(58) Field of Classification Search
 CPC ....... G06F 17/50; G06Q 30/0603; E03D 11/00
 USPC .......................................................... 4/256.1
 See application file for complete search history.

(56) References Cited

U.S. PATENT DOCUMENTS

| | | | |
|---|---|---|---|
| 561,576 | A | 6/1896 | Flannery |
| 733,102 | A | 7/1903 | Wilkinson |
| 875,973 | A | 1/1908 | Wood |
| 2,386,708 | A | 10/1945 | Morrison |
| 2,506,669 | A | 5/1950 | Heuacker |
| 2,691,172 | A | 10/1954 | Breslow |
| 2,693,603 | A | 11/1954 | Lehmann |
| 2,705,328 | A | 4/1955 | Felix |
| 2,785,561 | A | 3/1957 | Hoffman et al. |
| 2,811,724 | A | 11/1957 | Click et al. |
| 2,974,324 | A | 3/1961 | Lundelius |
| 3,393,408 | A | 7/1968 | Martin |
| 4,301,554 | A | 11/1981 | Wojcicki |

(Continued)

OTHER PUBLICATIONS

Hail, K., et al. "Potty Talk from Japan", Businessweek, Jan. 2, 2007: 1-2 Downloaded http://www.businessweek.com/print/globalbiz/content/jan2007/gb20070102_511509.htm.

(Continued)

*Primary Examiner* — Tuan N Nguyen
(74) *Attorney, Agent, or Firm* — Foley & Lardner LLP

(57) ABSTRACT

A method, an apparatus and a system for sizing a trapping device for trapping non-dispersing cloths and/or other materials in a toilet bowl and/or a hopper sink are disclosed. A computer device may be used to implement the method for sizing one or more trapping devices for installation at a facility, such as a medical institution. The computer device may be configured to determine a configuration of a trapway for each of one or more toilet bowls and/or hopper sinks at the facility. After determining the configuration, the computer device may determine a size of a trapping device corresponding to the determined configuration of each of the one or more trapways.

20 Claims, 30 Drawing Sheets

(56) References Cited

U.S. PATENT DOCUMENTS

| | | |
|---|---|---|
| 4,307,476 A | 12/1981 | Halstad |
| 4,376,313 A | 3/1983 | Morgan |
| 4,555,818 A | 12/1985 | Harrington |
| 4,932,080 A | 6/1990 | Pino |
| 5,027,447 A | 7/1991 | Pino |
| 5,117,862 A | 6/1992 | Molligan |
| 5,267,361 A | 12/1993 | Lai |
| 5,546,614 A | 8/1996 | King, II |
| 5,843,304 A | 12/1998 | Marchesseault et al. |
| 6,668,389 B1 | 12/2003 | Steinmetz et al. |
| 6,721,965 B1 | 4/2004 | Alston |
| 6,802,085 B2 | 10/2004 | Catanescu et al. |
| 7,096,516 B1 | 8/2006 | Moore, Jr. et al. |
| 7,120,949 B2 | 10/2006 | Wilburn |
| 7,150,050 B2 | 12/2006 | Sharp |
| 7,383,594 B1 | 6/2008 | Giesken et al. |
| 8,201,281 B2 * | 6/2012 | Hanifl .................... E03D 11/00 4/256.1 |
| 9,157,224 B2 | 10/2015 | Hanifl et al. |
| 2009/0113613 A1 | 5/2009 | Kole |
| 2009/0271295 A1 | 10/2009 | Hodge |
| 2011/0023219 A1 | 2/2011 | Hanifl et al. |
| 2012/0154169 A1 | 6/2012 | Hoekstra |
| 2013/0159143 A1 | 6/2013 | Cheney et al. |
| 2013/0297459 A1 * | 11/2013 | Kiser ................ G06Q 30/0603 705/27.1 |
| 2014/0068486 A1 | 3/2014 | Sellers et al. |

OTHER PUBLICATIONS

International Search Report and Written Opinion from International PCT Application No. PCT/US2013/046319, dated Oct. 28, 2013.

Chen Tian et al., "Interactive design and presentation of ceramic sanitary products," Third International Conference on Virtual Reality and Its Application in Industry, vol. 4756, Apr. 4, 2003 (Apr. 4, 2003), pp. 259-264.

Tighe Joseph et al., "Finding Things: Image Parsing with Regions and Per-Exemplar Detectors", IEEE Computer Society Conference on Computer Vision and Pattern Recognition, Proceedngs, IEEE Computer Society, US, Jun. 23, 2013 (Jun. 23, 2013), pp. 3001-3008.

Aug. 25, 2015 (WO) International Search Report—App PCT/US2015/027888.

* cited by examiner

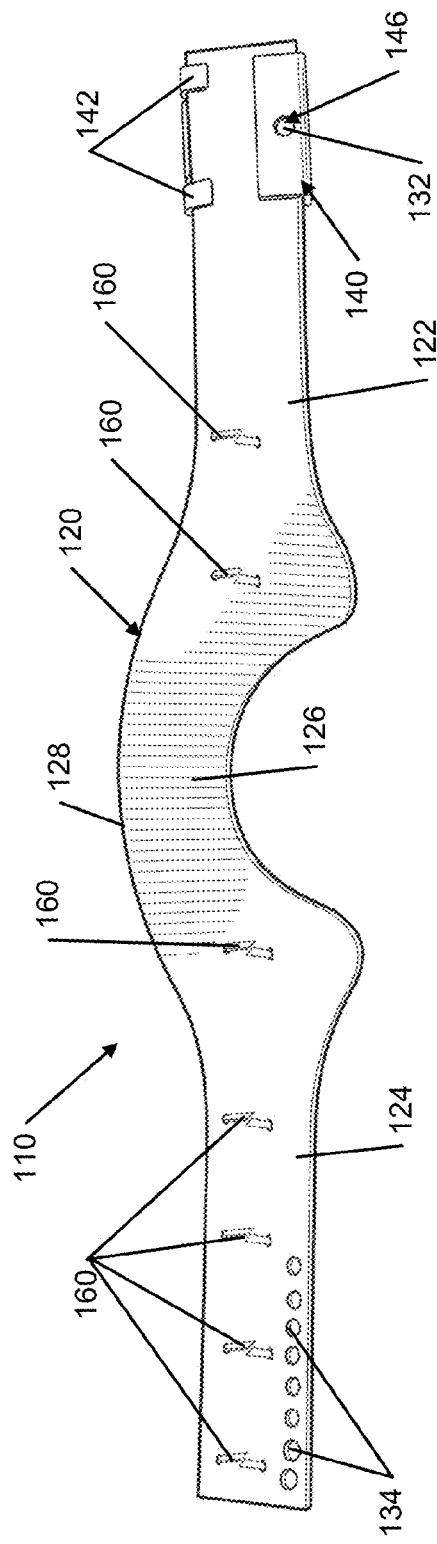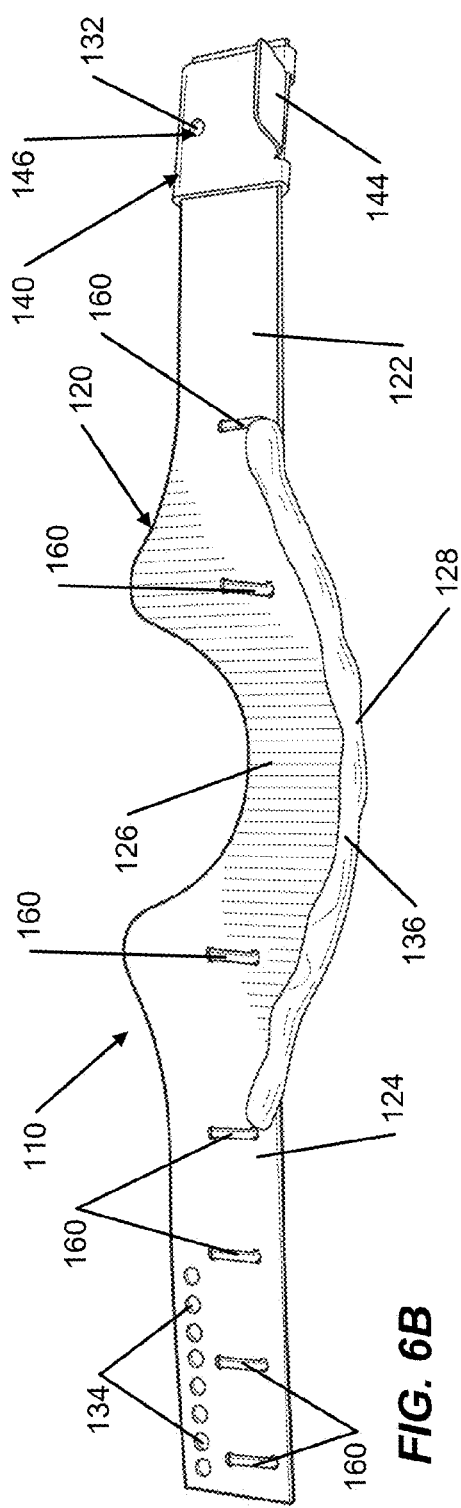
FIG. 6A
FIG. 6B

2700

General Information: Survey

Number of patient toilets and hopper sinks: [ ]

2710 →

1. Approximately how many maintenance calls are received per month? [ ]

2. Approximately what % of those calls are related to flushing issues/clogs? [ %]

3. Approximately what percentage clogs are caused by:

| | | | |
|---|---|---|---|
| Environmental/Sani wipes | [ %] | Disposable bathing/ incontinence wipes | [ %] |
| Reusable cotton washcloths | [ %] | Paper towels | [ %] |
| | | Other | [ %] |

(underpads, diapers, gloves, gauze, pens, etc. – please elaborate)
[ ]

🏠 ⓘ ⇦⇨   ( Delete )   ( Cancel ) ( Done )

General Information: Survey

Yes   No

4. Have you ever shut down a room or moved a patient due to clogs?  ☑  ☐

2810 → a. How many times has a room been shut down in the last 6 months? [ ]

b. Which unit has the highest frequency of room closures due to clogs? [ ]

c. How many toilets and/or hoppers in that unit? [ ]

d. What is the average total cost to the facility when a room is shut down? [$ ]

⊕ Expand for detailed list of potential cost factors.

| | | | |
|---|---|---|---|
| Lost Revenue | [$ ] | Equipment rental | [$ ] |
| Environmental Services | [$ ] | Electrical | [$ ] |
| Infection control | [$ ] | Drywall/tile | [$ ] |

🏠 ⓘ ⇦⇨   ( Delete )   ( Cancel ) ( Done )

General Information: Survey

- Infection control: $
- Plumbing: $
- Other: $
- Drywall/tile: $
- Outside Contractor: $
- Patient Dissatisfaction: $ Please Explain: _____

5. Have you ever shut down a unit due to clogs?   Yes ☑   No ☐ a. How many times have you shut down the unit in the last 6 months? ____ b. Which unit was effected? ____ c. How many toilets and hoppers in that unit? ____

[Delete] [Cancel] [Done]

General Information: Survey d. What is the average total cost to the facility when a unit is shut down? $____

⊕ Expand for detailed list of potential cost factors.

- Lost Revenue: $
- Environmental Services: $
- Infection control: $
- Plumbing: $
- Other: $
- Equipment rental: $
- Electrical: $
- Drywall/tile: $
- Outside Contractor: $
- Patient Dissatisfaction: $ Please Explain: _____

[Delete] [Cancel] [Done]

(3000, 2910)

SIZING APPLICATION FOR A TOILET BOWL TRAPPING DEVICE

RELATED APPLICATIONS

This application is a continuation-in-part application that claims priority to Non-Provisional application U.S. Ser. No. 13/526,191 filed Jun. 18, 2012, which is a continuation-in-part of U.S. patent application Ser. No. 12/533,782 filed Jul. 31, 2009, now U.S. Pat. No. 8,201,281 issued Jun. 19, 2012, each of which are incorporated herein by reference in their entirety.

FIELD OF THE INVENTION

The present invention is directed towards a sizing tool for a device for a toilet bowl, more specifically towards a sizing application for sizing a trapping device for catching and retaining non-dispersing cloths for use in a particular toilet bowl.

BACKGROUND

Manufacturers produce disposable cloths used for personal cleaning, bathing, incontinence care, and skin and surface disinfection. These cloths differ from other disposable hygiene products (such as toilet paper) in that they do not break down and disperse when in contact with water.

These non-dispersible cloths may be used in an environment where they are disposed of into a toilet. An accumulation of these cloths flushed down a toilet drain may eventually lead to a back up in the toilet, blockage of the wastewater drain system, malfunction of sewage pumps, accumulation in municipal sewers and wastewater treatment plants, or bursting of sewage pipes.

BRIEF SUMMARY OF THE INVENTION

The following presents a general summary of aspects of the invention in order to provide a basic understanding of at least some of its aspects. This summary is not intended as an extensive overview of the invention. It is not intended to identify key or critical elements of the invention or to delineate the scope of the invention. The following summary merely presents some concepts of the invention in a general form as a prelude to the more detailed description provided below.

In some embodiments, a method for sizing a trapping device for trapping non-dispersing cloths in one or more different toilet bowls may be implemented by a computer device. In some cases, the computer device may be used to implement the method for sizing one or more trapping devices for installation at a facility, such as a medical institution. The computer device may be configured to determine a configuration of a trapway for each of one or more toilet bowls at the facility. After determining the configuration, the computer device may determine a size of a trapping device corresponding to the determined configuration of each of the one or more trapways.

In some embodiments, an apparatus (e.g., the computer device) may be used in sizing one or more trapping devices for use at a facility, wherein each trapping device is for trapping non-dispersing cloths and/or other materials in a toilet bowl. For example, the computer device may include one or more processors communicatively coupled to one or more memory devices. The memory devices may be configured to store instructions, that when executed by the processor, cause the apparatus to at least determine a configuration of a trapway for each of one or more toilet bowls at a facility. The instructions may further cause the computer device to determine a size of a trapping device corresponding to the determined configuration of each of the one or more trapways.

In some embodiments, that may at least include the embodiments discussed above, a system for sizing a trapping device for trapping non-dispersing cloths in each of one or more toilets at a facility may include a computing device including a processor and a memory communicatively coupled to the processor. In some cases, the system may include a communication device coupled to the computing device. The memory may include one or more instructions that, when executed by a processor, may cause the computing device to solicit information about the one or more toilets at the facility. The information may include at least a configuration (e.g., jet position, no jet present, a fold away bowl configuration, a number of corners associated with the trapway, etc.). The instructions may cause the computing device to communicate information about each trapping device to at least one of a customer at the facility and a user at a supplier of the trapping device. The instructions may then cause the computing device to determine a trapping device for each of the one or more toilets at the facility. In some cases, the communication device may be configured to communicate information about each trapping device to at least one of a customer at the facility and a user at a supplier of the trapping device.

BRIEF DESCRIPTION OF THE DRAWINGS

A more complete understanding of the present invention and certain advantages thereof may be acquired by referring to the following description in consideration with the accompanying drawings, in which like reference numbers indicate like features, and wherein:

FIG. 6A illustrates a top plan view of the front side of an example trapping device for use in a toilet bowl with a jet-assist housing in accordance with the present invention;

FIG. 6B illustrates a top plan view of the back side of the trapping device from FIG. 6A in accordance with this invention;

FIGS. 27-30 show illustrative user interface screens to facilitate entry of a consumer survey associated with a particular facility.

The reader is advised that the attached drawings are not necessarily drawn to scale.

DETAILED DESCRIPTION OF THE INVENTION

In the following description of various examples of the invention, reference is made to the accompanying drawings, which form a part hereof, and in which are shown by way of illustration various example structures, systems, and steps in which aspects of the invention may be practiced. It is to be understood that other specific arrangements of parts, structures, example devices, systems, and steps may be utilized and structural and functional modifications may be made without departing from the scope of the present invention. Also, while the terms "top," "bottom," "front," "back," "side," and the like may be used in this specification to describe various example features and elements of the invention, these terms are used herein as a matter of convenience, e.g., based on the example orientations shown in the figures. Nothing in this specification should be construed as requiring a specific three dimensional orientation of structures in order to fall within the scope of this invention.

Figure 4:
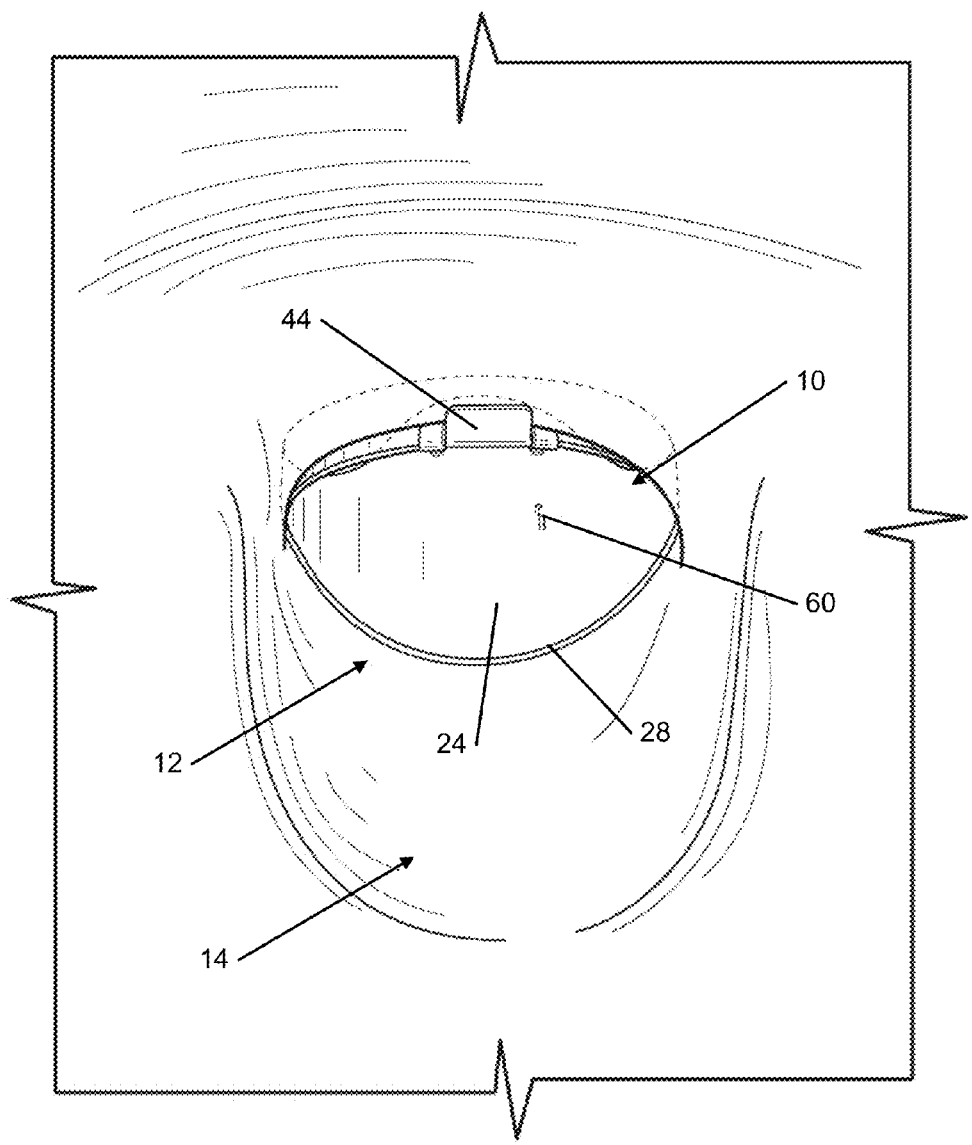
FIG. 4 illustrates a perspective view of the trapping device from FIG. 1A installed in a toilet bowl in accordance with this invention.
Figure 5:
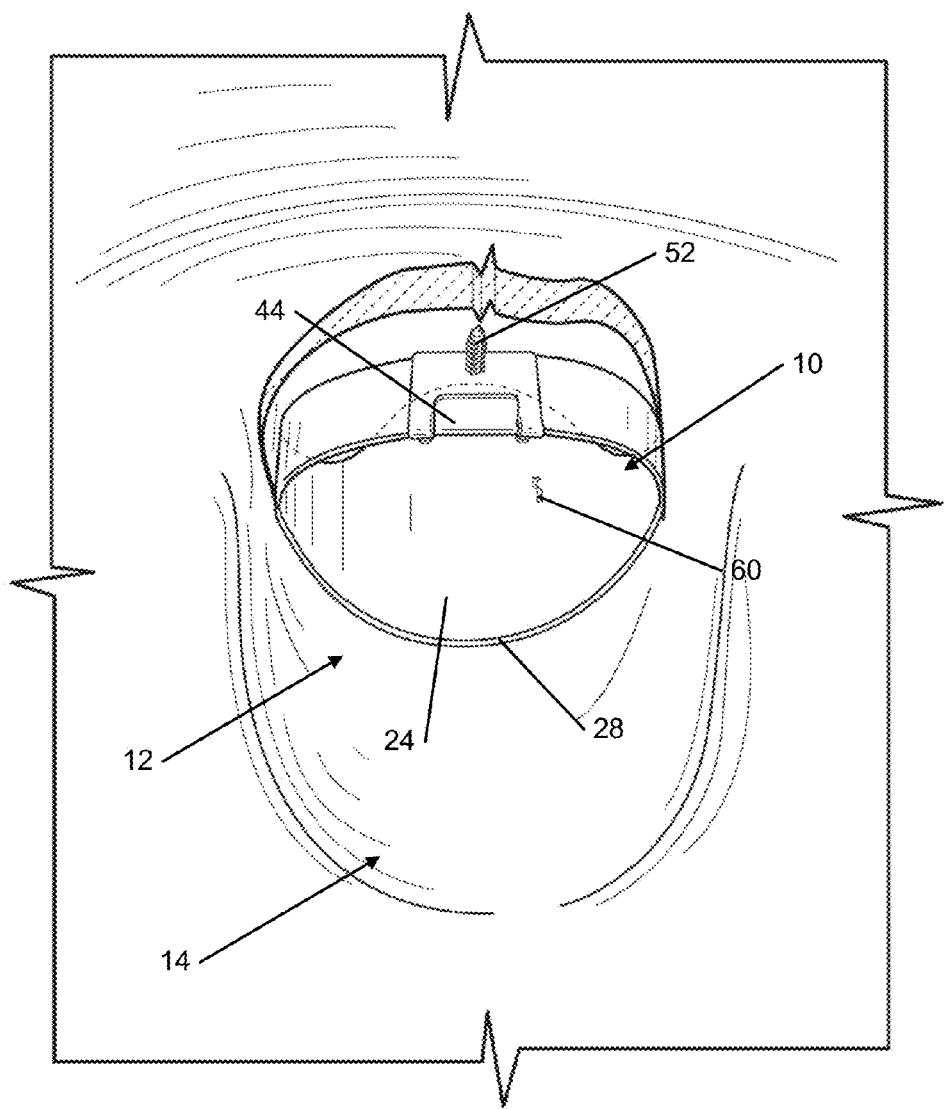
FIG. 5 illustrates a cut-out perspective view of the trapping device from FIG. 4 installed in the toilet bowl in accordance with this invention.
Figure 7:
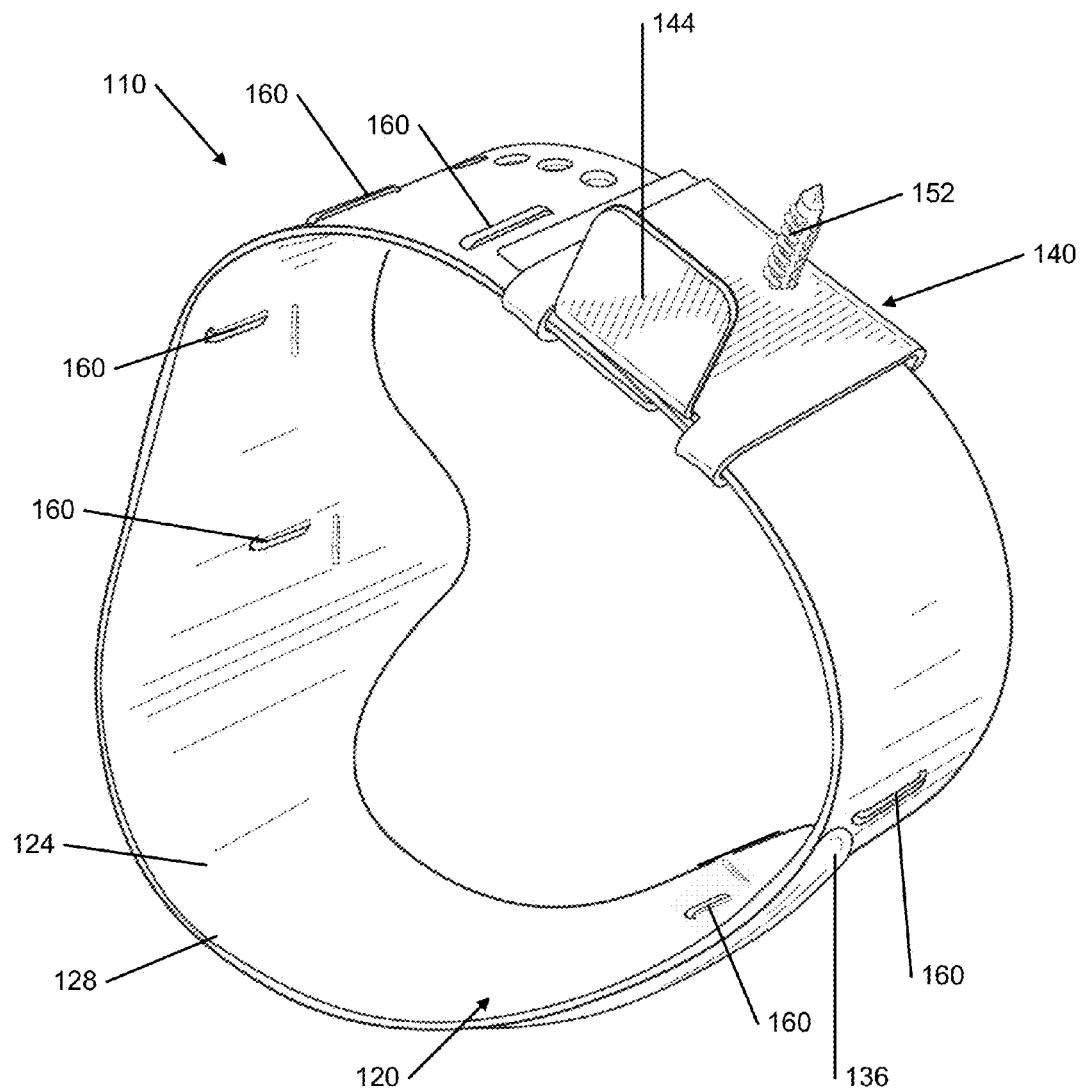
FIG. 7 illustrates a perspective view of the trapping device from FIG. 6A with both ends connected together in accordance with this invention.
Figure 8:
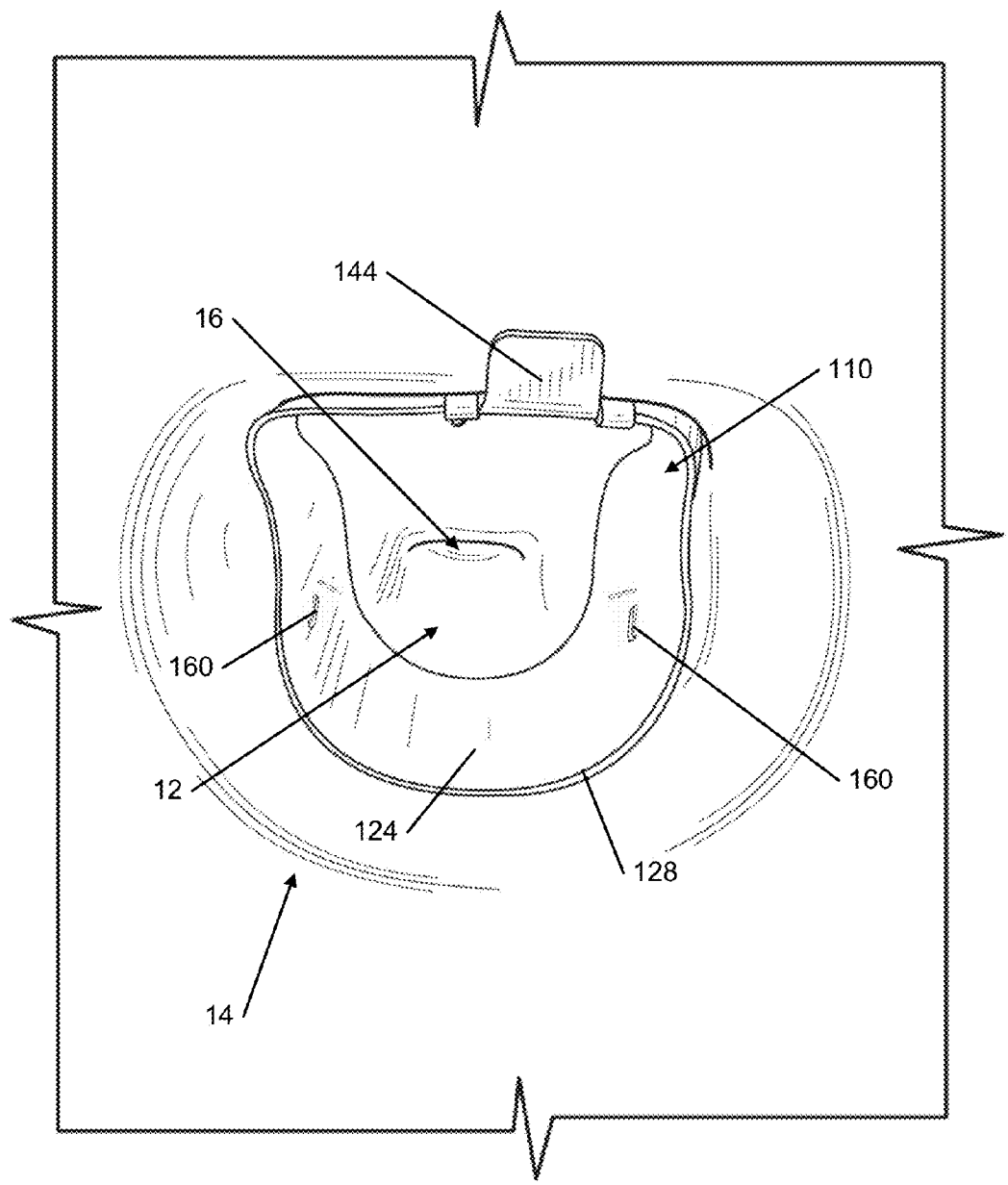
FIG. 8 illustrates a perspective view of the trapping device from FIG. 6A installed in a toilet bowl in accordance with this invention.

FIGS. 1A-3 illustrate a trapping device 10 for use in a toilet bowl 14 for trapping non-dispersing cloths. The trapping device 10 is comprised of a strap 20, an adjustment buckle 40, and a plurality of hooks 60. In one example in accordance with this invention, as illustrated in FIGS. 4 and 5 and discussed further below, the trapping device 10 is installed in a toilet bowl trapway 12 in the drain portion of the toilet bowl 14.

Figure 1A:
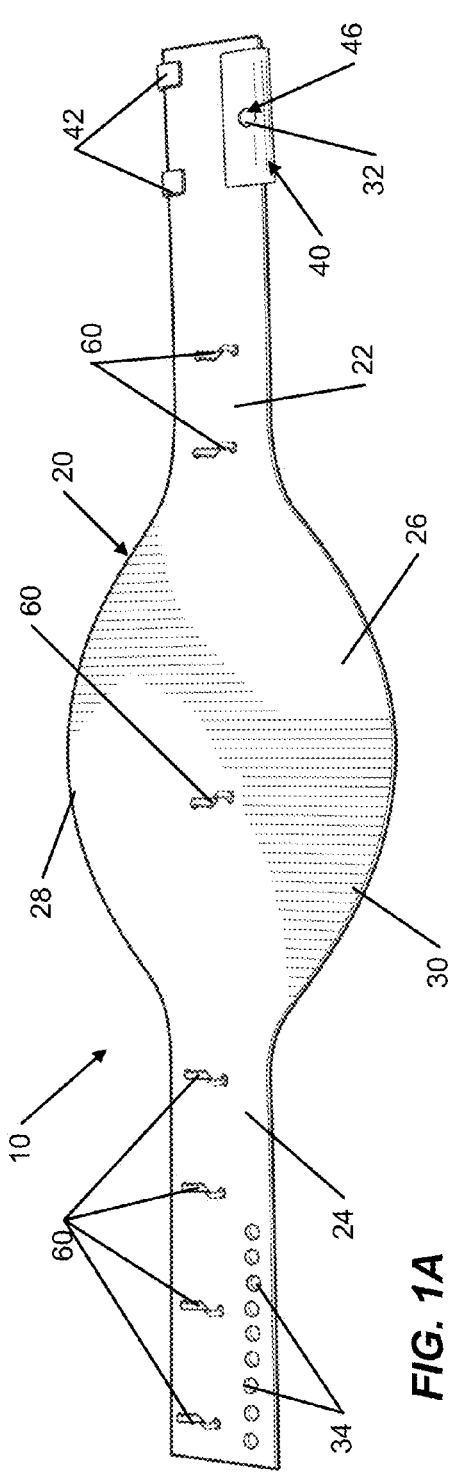
FIG. 1A illustrates a top plan view of the front side of an example trapping device in accordance with the present invention.
Figure 1B:
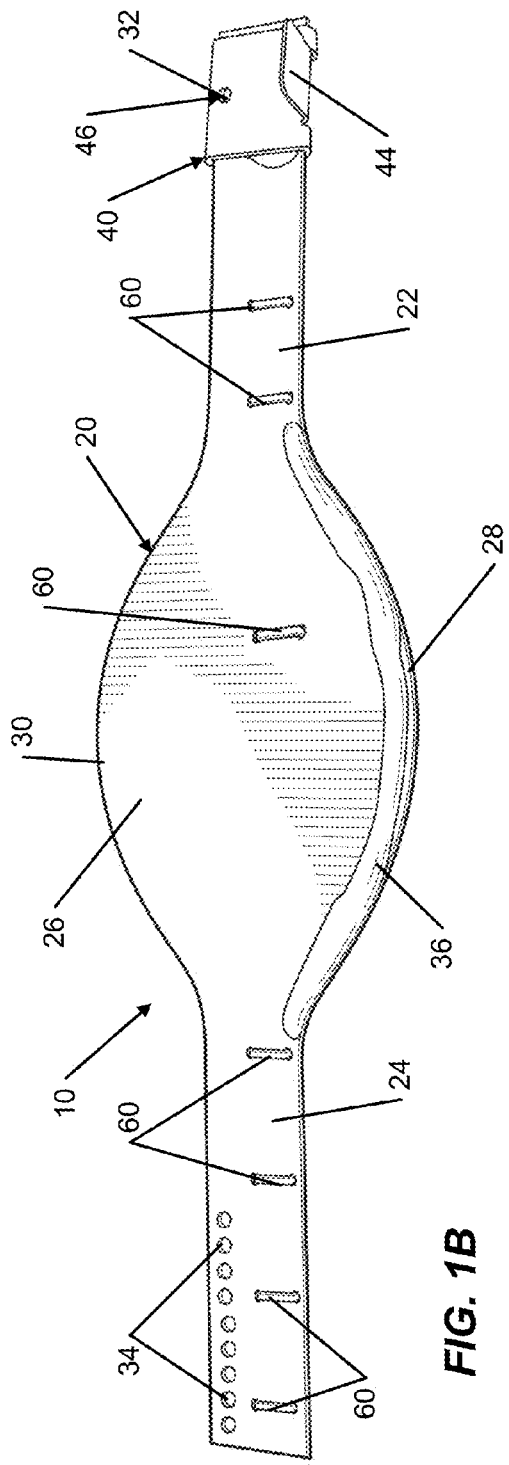
FIG. 1B illustrates a top plan view of the back side of the trapping device from FIG. 1A in accordance with this invention.
Figure 2A:
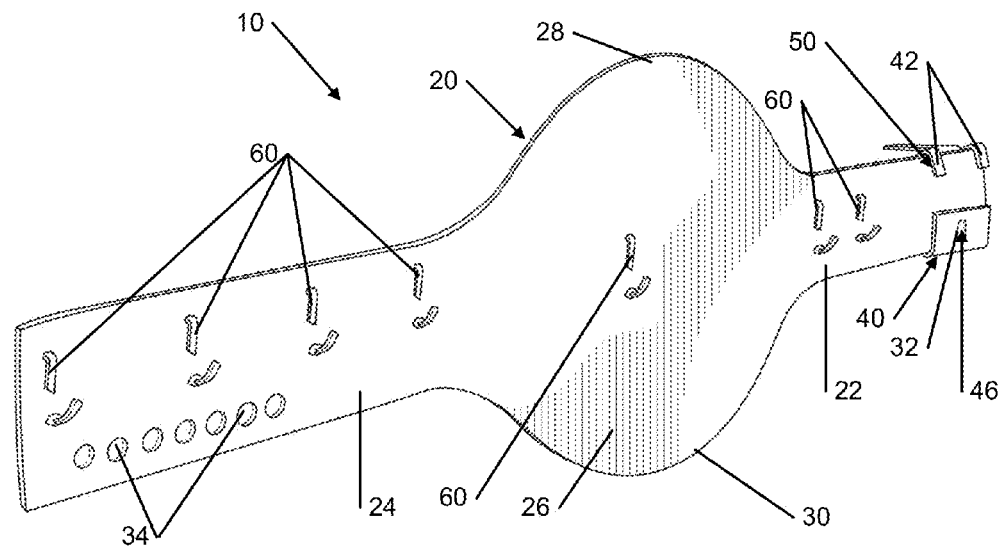
FIG. 2A illustrates a side perspective view of the front side of the trapping device from FIG. 1A in accordance with this invention.
Figure 2B:
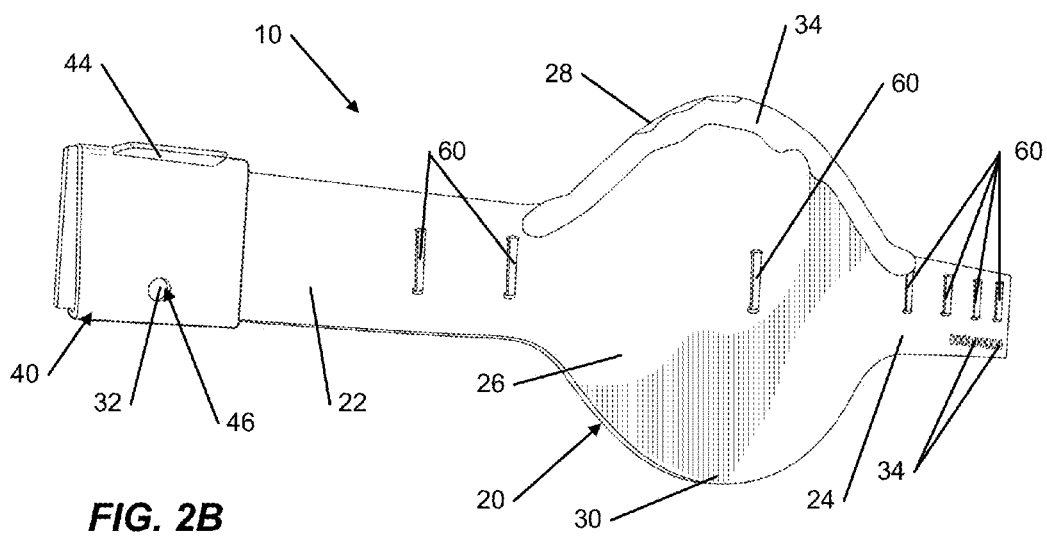
FIG. 2B illustrates a side perspective view of the back side of the trapping device from FIG. 1A in accordance with this invention.
Figure 3A:
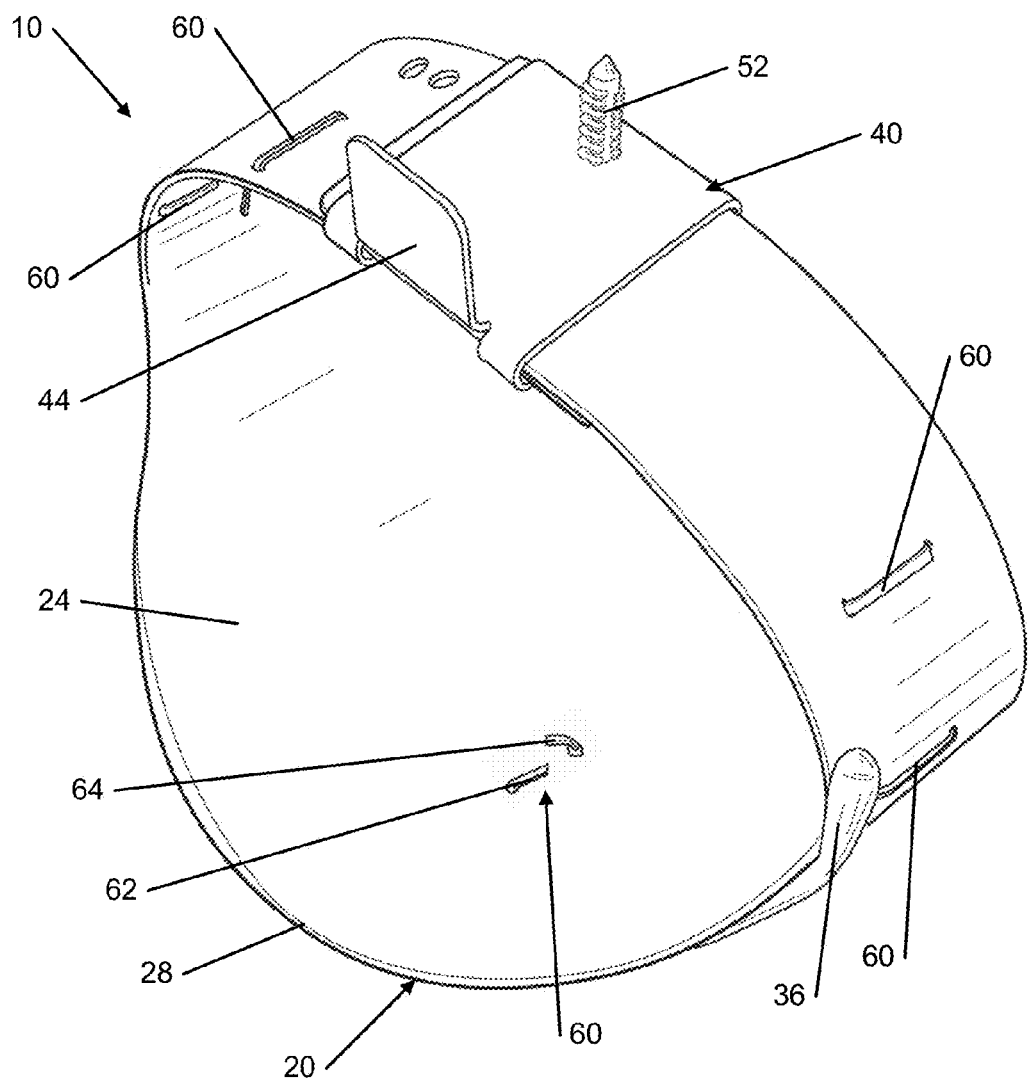
FIG. 3A illustrates a perspective view of the trapping device from FIG. 1A with both ends connected together in accordance with this invention.

As illustrated in FIGS. 1A-3A, the strap 20 may have a first end 22, a second end 24, and a middle portion 26 located in between the first end 22 and the second end 24. FIGS. 1A and 2A illustrate a top-view of the strap 20, while FIGS. 1B and 2B illustrate a bottom-view of the strap. FIG. 3A illustrates a view of the strap 20 with the ends 22, 24 connected together and prepared to be installed into the toilet bowl 14. The strap 20 has a leading edge 28 and a trailing edge 30 as illustrated in FIGS. 1A and 1B. The first end 22 and the second end 24 may be rectangular in shape, wherein the middle portion 26 may be many different shapes. In one example, as shown in FIGS. 1A and 1B, the middle portion 26 is rounded out on both the leading edge 28 and the trailing edge 30, such that the middle portion 26 may be somewhat similar to the shape of a football as can be seen in FIGS. 1A and 1B. The inventors have found that the rectangular shape for the first ends 22 and the second end 24 allow the flow of water through the toilet bowl 14 without obstructing the flow. The inventors have also found that the football shape middle portion 26 prevents the strap 20 and trapping device 10 from being sent down the drain of the toilet bowl 14 during routine operation. Additional shapes for the middle portion 26 are discussed later.

The strap 20 may be made of different materials without departing from the scope of the present invention. The strap material should allow the strap 20 to be able to fit within the various shapes of toilet bowls 14, yet also not fold or bend easily so that the strap 20 falls out of the trapway 12 of the toilet bowl 14. The strap 20 may be made of plastic, such as high density polyethylene (HDPE) to provide both strength and flexibility. Through testing by the inventor hereof, it has been found that using HDPE with a thickness between approximately 25-35 mil (0.025-0.035" thick) provides enough thickness to ensure that the trapping device 10 does not fold or bend easily, while also making the trapping device 10 thin enough to fit well within the majority of toilet bowl 14 configurations. In another exemplary embodiment, the strap may be approximately 30 mil HDPE. Alternatively, the strap 20 may be made of metal. While the strap 20 may be made of metal, some metals will corrode and rust when placed in a wet environment. The strap 20 may be made of a stainless steel that is non-corrosive in accordance with at least some examples of this invention.

The adjustment buckle 40 may be attached to the first end 22 of the strap 20 as will be discussed further below. Additionally, the first end 22 of the strap 20 includes a single hole 32. On the second end of the strap, there may be a plurality of adjustment holes 34. The cooperation of the adjustment buckle 40, the adjustment holes 34, and an adjustment connector 52 at the single hole 32 provides the user with the ability to adjust the diameter of the strap 20 to fit various sized toilet bowls 14, making the trapping device 10 adjustable and universal to various toilet bowls 14.

The middle portion 26 may also include a polymer band or strip 36 located along the leading edge 28 of one side, the under-side, of the middle portion 26. The band 36 may be made of a polymer substance or polymer bead, such as a hot-melt glue (e.g., 3M Jet melt adhesive, part#3764-AE). The band 36 may be in the shape of a narrow strip which extends along the leading edge 28 of the middle portion 26. The band 36 creates a seal between the trapping device 10 and the bottom of the toilet bowl 14, which diverts the water flow above and through the trapping device 10 rather than beneath the trapping device 10. The band 36 may be made of any similar substance or similar shape in accordance with examples of this invention as long as it diverts the water flow above and through the trapping device 10 rather than beneath the trapping device 10.

The adjustment buckle 40 may be attached to the first end 22 of the strap 20 by an epoxy or glue material bonding the strap 20 to the adjustment buckle 40. The adjustment buckle 40 may include a set of front guides 42, a front tab 44, an alignment hole 46 and an adjustment connector 52. The set of front guides 42 are located on the front side of the adjustment buckle 40 and may include one or more guides. The set of front guides 42 are bent 180 degrees from the adjustment buckle 40, thereby creating a slot 50 between the strap 20 and the adjustment buckle 40. When the adjustment buckle 40 is connected to the strap 20, the set of front guides 42 may be positioned such that the second end 24 of the strap 20 can slide through the slot 50. Additionally, the set of front guides 42 are sized such that the hooks 60 do not interfere with the adjustment buckle 40 when sliding the second end 24 of the strap 20 through the adjustment buckle 40 and while the hooks 60 are in an adjacent lateral position with the adjustment buckle 40. The front tab 44 may be located on the front side of the adjustment buckle 40 and may protrude from the adjustment buckle 40 perpendicularly. The alignment hole 46 is located on the adjustment buckle 40 on the side opposite the front tab 44. When the adjustment buckle 40 is installed on the strap 20, the alignment hole 46 lines up with one of the adjustment holes 34 on the second end 24 of the strap 20 to receive the adjustment connector 52. The adjustment connector 52 may be inserted through the alignment hole 46 on the adjustment buckle 40, one of the adjustment holes 34 on the second end 24 of the strap 20, and the single hole 32 on the first end 22 of the strap 20 when the first end 22 of the strap 20 is inserted into the adjustment buckle 40. The adjustment connector 52 may hold the adjusted size of the trapping device 10 in place. The adjustment connector 52 may be in the form of a rivet, a screw, or other connector in accordance with at least some examples of this invention.

The adjustment buckle 40 may be made of different materials without departing from the scope of the present invention. The adjustment buckle 40 should be made of a material that is non-corrosive so that the adjustment buckle 40 does not rust in the wet environment. Through testing, the inventors have found that 24-gauge 316 passivated stainless steel may be used as the material for the adjustment buckle 40. Additionally, other materials may be used for the material for the adjustment buckle 40 without departing from at least some examples of this invention, such as plastic or other non-corrosive metals.

Additionally, the adjustment connector 52 may be made of different materials without departing from the scope of the present invention. The adjustment connector 52 should also be made of a material that is non-corrosive so that the adjustment connector 52 does not rust in the wet environment. Through testing, the inventors have found that a plastic rivet may be used for the adjustment connector 52 (e.g., Pine-Tree Clip black, Thread Rite Screw Products, Part #M36 0300 02). Additionally, other materials, such as screws, pins, etc., may be used for the adjustment connector 52 without departing from at least some examples of this invention, such as stainless steel or other non-corrosive metals.

As shown in FIGS. 1A-3A, the plurality of hooks 60 are attached to the strap at various locations. The hooks 60 are used to catch and retain the non-dispersing cloths, while allowing other materials to pass by. The hooks 60 may be located on the first end 22 of the strap 20, the second end 24 of the strap 20, or middle portion 26 of the strap 20 or any combination thereof. Through testing by the inventor hereof, it has been found that the number, location, angle, and sharpness of the hooks 60 provides an optimal balance between catching the non-dispersing cloths, while allowing other materials to pass. The inventors have found that with too many hooks 60, the trapping device 10 then catches the non-dispersing cloths while also catching many of the undesirable toilet paper and waste. The inventors have also found that with using too few hooks 60, the trapping device 10 then does not catch all of or a significant percentage of the non-dispersing cloths. The inventors have found that a functional number of hooks 60 to be installed on the strap 20 is between five and nine hooks 60, with less hooks 60 being used in the smaller version of the trapping device 10. In other embodiments in accordance with this invention, the number of hooks 60 can be outside the range of five to nine hooks. In an embodiment, at least five hooks are included. In another embodiment, no more than nine hooks 60 are included. In an alternative exemplary embodiment in accordance with this invention, the strap 20 may include seven hooks 60, with five or six hooks 60 being used in a smaller version of the trapping device 10. Additionally, in an embodiment, these hooks 60 may be located approximately an inch apart, with, for example, two hooks 60 located on the first end 22 of the strap 20, four hooks 60 located on the second end 24 of the strap 20, and one hook 60 located on the middle portion 26 of the strap 20, as shown in FIGS. 1A-2B. Additionally, the inventors have found that the hooks 60 may need to be forward enough, i.e. closer to the leading edge 28 of the strap 20, so that the non-dispersing cloths are visible to the user when the trapping device 10 is installed in the toilet bowl 14.

The angle of the hook 60 may also be important to catching and retaining the non-dispersing cloths while allowing other materials to pass. The inventors have found that an appropriate angle for the hooks 60 is between approximately 45 and 60 degrees angled away from the strap 20 with the point of the hook 60 facing into the toilet bowl 14. When the hooks 60 are angled at 90 degrees, it was found that the cloths would catch and then fall off. In an embodiment in accordance with this invention, the angle of the hooks 60 is less than 90 degrees and greater than approximately 15 degrees. The number, location, and angle of the hooks 60 can vary without departing from at least some examples of this invention.

The hooks 60 may be made of different materials without departing from the scope of the present invention. The hook material should be rigid and inflexible. The hook material should be able to remain substantially in position during toilet bowl cleaning, and if moved from position, go back into substantially the same position after the cleaning. Additionally, the hook material should be a non-corrosive material so that the hooks 60 do not rust in the wet environment. Also, the hooks 60 may be sharp, such as sharp enough to catch the non-dispersing cloths, while being able to break or cut through the toilet paper and waste in the toilet 14.

Figure 3B:
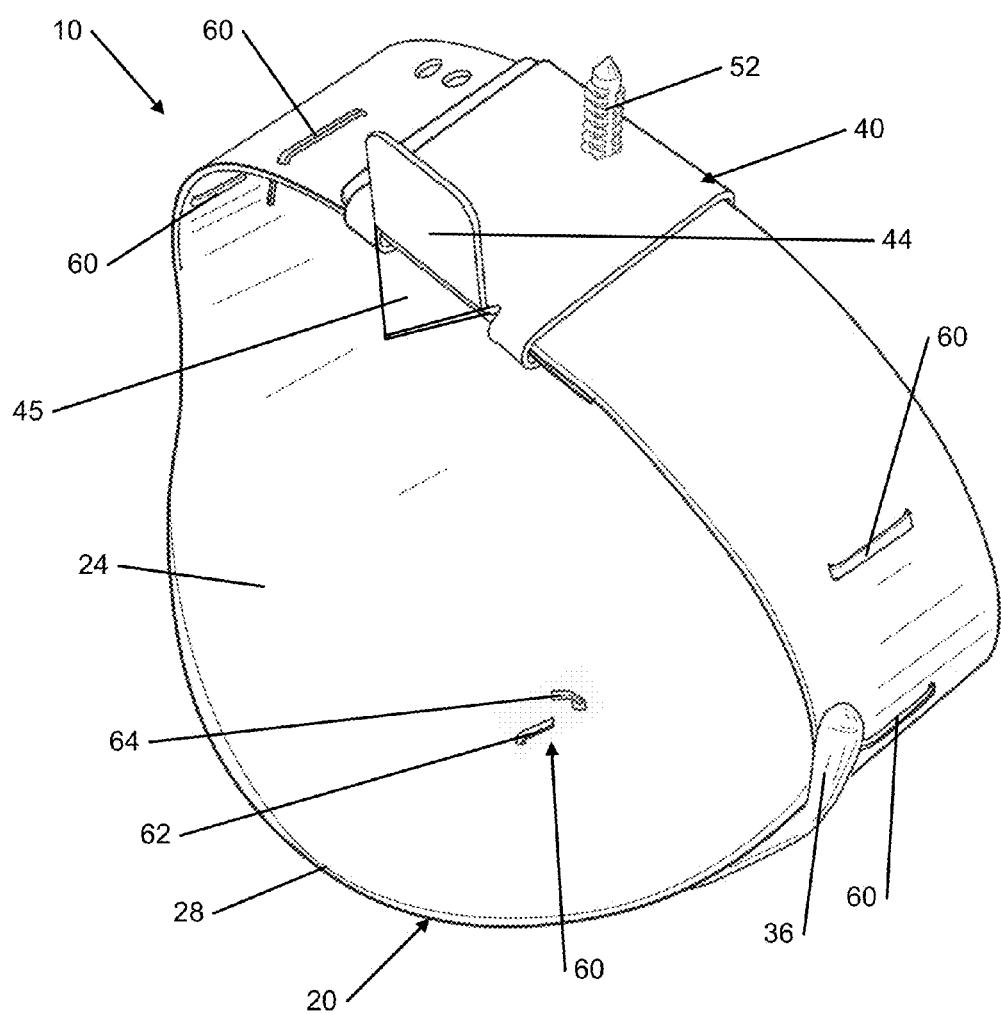
FIG. 3B illustrates a perspective view of the trapping device from FIG. 3A with a tooth in accordance with this invention.

Additionally, barbed hooks 60 may be used without departing from at least some examples of the invention. The barbed hooks 60 may have a "T" barb to catch the non-dispersing cloths. Additionally, the adjustment buckle 40 may include a tooth 45 which acts as another hook, as illustrated in FIG. 3B. The tooth 45 may extend from either front or back of the adjustment buckle 40. The tooth 45 may be triangular shaped. This tooth-type hook 45 may be used to enhance the ability of capturing different types and weights of cloths. This tooth-type hook 45 may be different shapes or in different locations without departing from this invention. Through testing, the inventors have found that a heavy duty staple may be used as the hooks 60 (e.g., Surebonder ⁵⁄₁₆" stainless steel, No. 4, heavy duty, T50). When the heavy duty staple is used for the hooks 60, the staple may be inserted into the strap 20 from the back side of the strap 20, with a first leg 62 and a second leg 64 of the staple protruding out of the front side of the strap 20. The first leg 62 of the staple may be bent to lay flat against the front side of the strap 20, while the second leg 64 may be bent to an angle between 45-60 degrees. Additionally, other materials may be used for the hook 60 material without departing from at least some examples of this invention, such as Velcro (e.g., hook and loop fastener), fishing hooks, and plastic hooks. Each of these examples may have their drawbacks, but could be found effective if used in combination or in different numbers.

The trapping device 10, as described above, may be installed in a toilet 14 by a user. To install the trapping device 10, the user may first prepare the trapping device 10 for installation, as shown in FIG. 3A. To prepare the trapping device 10 for installation, the user may first insert the second end 24 of the strap 20 with the plurality of adjustable holes 34 into the slots 50 provided between the two front guides 42 of the adjustment buckle 40 and the first end 22 of the strap 20. The slots 50 on the back side of the strap 20 receive the second end 24 of the strap 20 which allows for size adjustment based on the size of the toilet bowl trapway 12. Because the size of toilets 14 vary, the user may size the trapping device 10 to properly fit the trapping device 10 into the toilet bowl trapway 12. Once the two ends 22, 24 of the strap 20 are adjusted to fit the toilet bowl trapway 12, the adjustment connector or rivet 52 may be inserted through the adjustment buckle 40, the single alignment hole 32, and the selected adjustment hole 34 on the second end 24 of the strap 20 to hold the adjusted size in place. The trapping device 10 as shown in FIG. 3A is prepared for installation into the toilet bowl 14.

Figure 10:
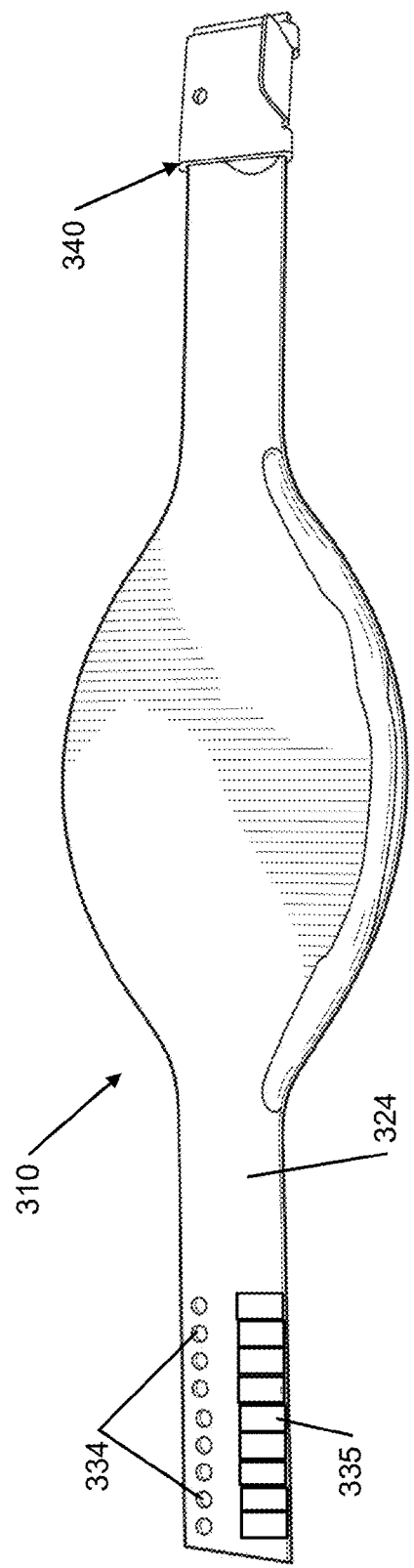
FIG. 10 illustrates a top plan view of an example sizing tool in accordance with this invention.

As illustrated in FIG. 10, when installing the trapping device 10 into the toilet bowl trapway, the user may first use a sizing tool 310. The sizing tool 310 is similar to the trapping device 10 as described above, without the hooks 60. The sizing tool 310 may include colors strips 335 that consist of multiple distinct colors that match up with each of the adjustment holes 334. The user may place the sizing tool 310 into the toilet bowl trapway 12 and expand the strap of the sizing tool fully in the drain by sliding the end of the strap 324 through the adjustment buckle 340. The user may then note the color 335 indicated on the sizing tool 310. The color 335 indicated on the sizing tool 310 may then correspond to an adjustment hole 34 on the trapping device 10, thus allowing the user to install the trapping device 10 into the trapway. This sizing tool 310 may be used with the installation of the trapping device 10, however, this sizing tool 310 is not required for the installation of the trapping device 10.

As illustrated in FIGS. 4 and 5, the user may install the trapping device 10 into the toilet bowl trapway 12. To install the trapping device 10 into the toilet bowl trapway 12, the user may first set the trapping device 10 at an angle with the top of the rivet 52 under the top side of the toilet bowl trapway 12. The user may then slide the trailing edge 30 of the middle portion 26 of the strap 20 into the bottom of the toilet bowl trapway 12. The band 36 on the under-side of the middle portion 26 of the strap 20 may create a seal with the bottom of the toilet bowl trapway 12, thereby helping water to flow over the trapping device 10, rather than under the trapping device 10. When the band 36 is seated against the bottom of the toilet bowl trapway 12, the front tab 44 is seated against the front portion of the top side of the toilet bowl trapway 12. With the front tab 44 seated in this location on the toilet bowl trapway 12, the trapping device 10 is prevented from being pushed into the drain during normal toilet bowl operations, such as flushing, and normal toilet bowl cleaning. Additionally, the shape of the middle portion 26 of the strap 20, the general football shape, helps prevent the trapping device 10 from being pushed down the drain during normal toilet bowl operations, such as flushing, and normal toilet bowl cleaning. The combination of the rivet 52, the front tab 44, and the shape of the middle portion 26 all help to keep the trapping device 10 in the proper location throughout the entire flushing process, with water exiting through the drain and water flowing upward after the flush to fill the toilet bowl 14. As illustrated in FIGS. 4 and 5, the leading edge 28 of the strap 20 may be the only part of the trapping device 10 that the user can see when the trapping device 10 is installed in the toilet bowl 14.

Additionally, as illustrated in FIGS. 4 and 5, the majority of hooks 60 may be located on the top and the sides of the installed trapping device 10. The hooks 60 may be located in this location so that they do not interfere with human waste. The single hook 60 on the bottom of the installed trapping device 10 is located on the bottom to prevent heavy cloths from slipping by the top hooks 60. Because of the weight, these heavy cloths are more capable of dropping to the bottom of the toilet bowl trapway 12 during the flushing, and thereby may be caught by the bottom hook 60 in the middle portion 26.

The color of the trapping device 10 has been found to be important when installed in the toilet bowl 14. Through testing, the inventors have found that a strap 20 with a color in contrast with the non-dispersing clothes is useful. For example, a black strap 20 contrasts with the caught white non-dispersing clothes for the user, who may be responsible for removing the caught cloths from the trapping device 10. The inventors found when using white plastic for the strap 20, the white strap 10 does not contrast enough with the white non-dispersible cloths and the white toilet bowl 14 and therefore it was difficult to differentiate the caught cloths from the trapping device 10. Other colors may be used for the trapping device 10 or the strap 20 without departing from at least some examples of this invention, as long as the color contrasts with the white non-dispersible cloths.

Additionally, the user may utilize a disposable retrieval hook to retrieve the cloths that have been caught by the trapping device 10. The retrieval hook may be a metal or plastic hook designed to retrieve cloths from the trapping device 10.

Once installed, the trapping device 10 can also be removed from the toilet bowl 14. The user may need to use pliers or a similar tool to remove the trapping device 10 from the toilet bowl trapway 12 because of the close fit and the combination of the rivet 52 and the front tab 44 fit with the top of the toilet bowl trapway 12. Additionally, the trapping device 10 may be semi-permanently installed in the toilet bowl 14. This semi-permanent installation may be accomplished by using epoxy or cement or some other glue material without departing from the scope of this invention.

FIGS. 6A-8 illustrate an example combination according to this invention similar to that described above in conjunction with FIGS. 1A-5 (the same or similar reference numbers are used in FIGS. 6A-8 as those used in FIGS. 1A through 5 to denote the same or similar parts). FIGS. 6A-8 illustrate a trapping device 110 for a toilet bowl with a "jet-assist" housing 16 near the toilet bowl trapway 12. The jet-assist propels water into the trapway 12 to aid in clearing the toilet bowl 14. As FIGS. 6A-8 illustrate, the jet-assist trapping device 110 may have a section from the middle portion 126 that is cut away to accommodate the jet-assist housing 16. Additionally, the location of the hooks 160 may be slightly different because of the smaller middle portion 126. Similar to the trapping device 110 described above, the hooks 160 may be located approximately an inch apart, with one hook 160 located on the first end 122 of the strap 120, four hooks 160 located on the second end 124 of the strap 120, and two hooks 160 located on the middle portion 126 of the strap 120, as illustrated in FIGS. 6A and 6B. The two hooks 160 located on the middle portion 126 may be located on the middle portion 126 next to where the jet-assist housing 16 is located. The number, location, and angle of the hooks 160 on the strap 120 can vary without departing from at least some examples of this invention.

Figure 9A:
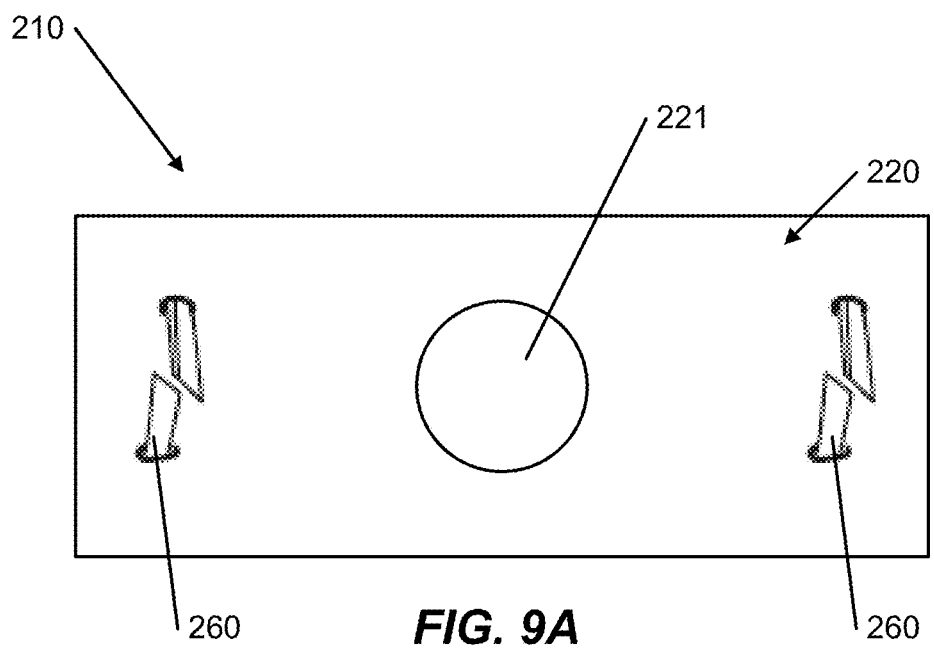
FIGS. 9A and 9B illustrate a top plan view of an example trapping device for use in a toilet bowl.
Figure 9B:
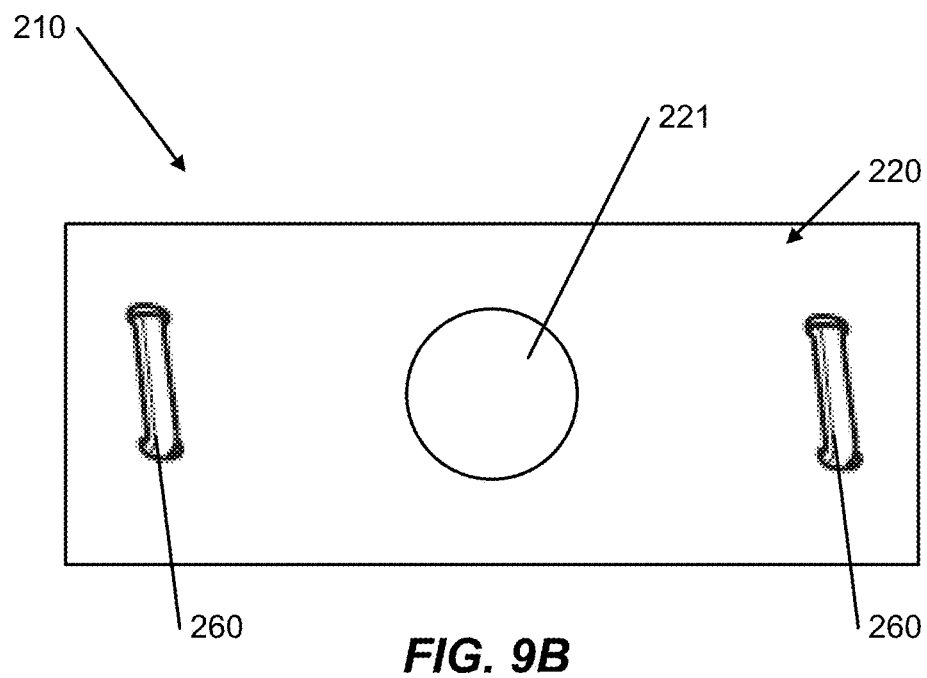

FIGS. 9A and 9B illustrate an example combination according to this invention similar to that described above in conjunction with FIGS. 1A-5 (the same or similar reference numbers are used in FIGS. 9 and 10 as those used in FIGS. 1A through 5 to denote the same or similar parts). FIG. 9A illustrates a front-view of a glue-in trapping device 210 for use in a toilet bowl 14. FIG. 9B illustrates a back-view of the glue-in trapping device 210. The glue-in trapping device 210 includes a mini-strap 220 and at least one hook 260. Each mini-strap 220 may be rectangular in shape with a hole 221 in the middle of the mini-strap 220. On each side of the hole 221, there may be two hooks 260 positioned vertically along the mini-strap 220. In this example, multiple mini-straps 220 may be installed in the toilet bowl trapway 12.

As shown in FIGS. 9A and 9B, the mini-strap 220 may be rectangular in shape and may be approximately ½"×1¼". The mini-strap 220 may be made of a number of different materials without departing from the scope of the present invention. The mini-straps 220 may be made of plastic, such as 30 mil HDPE to provide both strength and flexibility. Alternatively, the mini-straps 220 may also be made of metal. While the mini-strap 220 may be made of metal, some metals will corrode and rust when placed in a wet environment. The mini-strap 220 may be made of a stainless steel that may be non-corrosive in accordance with at least some examples of this invention. The hole 221 may be located in the center of the mini-strap 220 and aids in affixing the mini-strap 220 to the toilet bowl 14. The hole 221 may be approximately ¼" in diameter. The mini-strap 220 and hole 221 may be different shapes and sizes without departing from the scope of the present invention.

Additionally, as shown in FIGS. 9A and 9B, the mini-strap 220 may include at least one hook 260. The mini-strap 220 illustrated in FIG. 9 has two hooks 260, one on each side of the mini-strap 220. As was described above, the hooks 260 are used to catch and retain the non-dispersible cloths, while allowing other materials to pass by. The optimal angle for the hooks 260 is between approximately 45 and 60 degrees from the mini-strap 220 with the point of the hook 220 facing into the toilet bowl 14. The number, location, and angle of the hooks 260 can vary without departing from at least some examples of this invention.

As described above for FIGS. 1A-5, the hooks 260 may be made of a number of different materials without departing from the scope of the present invention. The hook material must be rigid and inflexible. Additionally, the hook material should be a non-corrosive material so that the hooks 260 do not rust in the wet environment. Also, the hooks 260 may be sharp, such as sharp enough to catch the non-dispersing cloths, while breaking or cutting through the toilet paper and waste in the toilet 14. Additionally, barbed hooks 260 may be used without departing from at least some examples of the invention. The barbed hooks 260 may have a "T" barb to catch the non-dispersing cloths. Through testing, the inventors have found that a heavy duty staple may be used for the hooks 260 (e.g., Surebonder ⁵⁄₁₆" stainless steel, No. 4, heavy duty, T50). Additionally, other materials may be used for the hooks 260 without departing from at least some examples of this invention, such as Velcro, fishing hooks, and plastic hooks. Each of these examples may have their drawbacks, but could be found effective if used in combination or in different numbers.

When installing the glue-in trapping device 210 as described above, the user places and holds the mini-strap 220 in a preferred location. The hole 221 in the mini-strap 220 allows for the epoxy to be squeezed through the mini-strap 220 when pressed against the toilet bowl 14 and flattened against the other side. This epoxy may form an epoxy "rivet"/head that holds the mini-strap 220 and the hooks 260 securely in place on the toilet bowl 14. The toilet bowl 14 should be completely dry to stick the epoxy. The epoxy may be an underwater epoxy, thereby allowing the epoxy to dry underwater and allowing for a quick installation and quick return to use for the toilet bowl 14. There may be four mini-straps 220 affixed to the top and sides of the toilet bowl trapway 12 and one additional mini-strap 220 may be affixed to the bottom of the trapway 12 for reasons as discussed above. Additionally, depending on the size of the toilet bowl 14, the number of mini-straps 220 can increase or decrease without departing from at least some examples of this invention. Additionally, a "mini-strap" mounting peg may be permanently attached, wherein the removable "mini-strap" may be affixed to the mounting pegs and changed out or replaced if damaged.

In another example trapping device 10 according to aspects of this invention, the strap 20 and the trapping device 10 as discussed above and illustrated in FIGS. 1A-5 may be built into the toilet 14 itself. For example, during the manufacturing process of the toilet bowl 14, the strap 20 and the trapping device 10 may be installed within the ceramic of the toilet bowl 14, thereby making the strap 20 and the trapping device 10 a permanent fixture of the toilet bowl 14.

In another example trapping device 10 according to aspects of this invention, the hooks 60 may be installed or formed integral to the toilet bowl 14. For example, during the manufacturing process of the toilet bowl 14, a plurality of hooks 60 may be singularly installed within the ceramic of the toilet bowl 14, thereby making the hooks 60 a permanent fixture of the toilet bowl 14. The location and number of hooks 60 may be similar to those as discussed above for FIGS. 1A-5. There may be approximately 5 to 6 hooks 60 spaced approximately 1" apart and located on the upper and side portions of the toilet bowl trapway 12, with one additional hook 60 located on the bottom of the toilet bowl trapway 12. In this example, the hooks 60 may be made of the same materials as discussed above or may be made of a material similar to or the same as the material of the toilet bowl.

FIGS. 11-14 illustrate another example embodiment according to this invention similar to that described above in conjunction with FIGS. 1A-5 (the same or similar reference numbers are used in FIGS. 11 through 14 as those used in FIGS. 1A through 5 to denote the same or similar parts).

FIGS. 11-14 illustrate a trapping device 410 for use in a toilet bowl 14 for trapping non-dispersing cloths. The trapping device 410 is comprised of a strap 420, a compression system 480, and a plurality of hooks 460. In one example in accordance with this invention, as illustrated in FIGS. 11-14 and discussed further below, the trapping device 410 is installed in a toilet bowl trapway 12 in the drain portion of the toilet bowl 14.

As illustrated in FIGS. 11-14, the strap 420 may have a first end 422, a second end 424, and a middle portion 426 located in between the first end 422 and the second end 424. FIGS. 11-14 illustrate a top-view of the strap 420, while FIGS. 11-14 illustrate a bottom-view of the strap 420. The strap 420 has a leading edge 428 and a trailing edge 430 as illustrated in FIGS. 11-14. The first end 422 and the second end 424 may be rectangular in shape, wherein the middle portion 426 may be many different shapes. In one example, as shown in FIGS. 11-14, the middle portion 426 is rounded out on both the leading edge 428 and the trailing edge 430, such that the middle portion 426 may be somewhat similar to the shape of a football as can be seen in FIGS. 11-14. Additional shapes for the middle portion 426 are discussed later.

The strap 420 may be made of different materials without departing from the scope of the present invention. First, the strap material should be resilient enough to bend and spring back to the previous shape. The strap material should allow the strap 420 to fit within the various shapes of toilet bowls 14, yet also not fold or bend easily so that the strap 420 falls out of the trapway 12 of the toilet bowl 14. The strap 420 may be made of plastic, such as high density polyethylene (HDPE) to provide both strength and flexibility. Alternatively, the strap 420 may be made of a resilient metal, such as a stainless steel. Other metals maybe utilized without departing from this invention. While the strap 420 may be made of metal, some metals will corrode and rust when placed in a wet environment. The strap 420 may be made of a stainless steel that is non-corrosive in accordance with at least some examples of this invention.

The compression system 480 may be utilized to hold the trapping device 410 together during installation and then release the trapping device 410 when installed in the toilet bowl 14. The compression system 480 may first compress the trapping device 410 in order to install the trapping device 410 in a toilet bowl 12. Secondly, then the compression system 480 may uncompress, expand, and/or release the trapping device 410 once installed in the toilet bowl 14 to ensure the trapping device 410 remains installed in the toilet bowl 12. Many different compression systems may be utilized without departing from this invention. One compression system 480, as illustrated in FIGS. 11-14, utilizes a pair of tabs 482 and a retention band 484. The pair of tabs 482 may include a first tab 482A and a second tab 482B. The first tab 482A may be located on the first end 422 of the strap 420 extending perpendicular to the strap 420 and extending inwards toward the center of the strap 420. The second tab 482B may be located on the second end 422 of the strap 420 extending perpendicular to the strap 420 and extending inwards towards the center of the strap 420. The tabs 480 may be generally sized and shaped such that a tool or pliers can grasp and/or hold the tabs together during the installation process, which will be explained in more detail below.

Additionally, as illustrated in FIGS. 11-14, the compression system 480 may include a retention band 484. The retention band 484 may be a band that holds the trapping device 410 in a semi-compressed configuration, as specifically illustrated in FIG. 11-14. The semi-compressed configuration may be defined by the tabs 482A 482B partially separated with the first end 422 and the second end 424 slightly overlapping. The retention band 484 may be made of any material capable of holding the strap 420 in the semi-compressed configuration. In one embodiment of the invention, the retention band 484 may be made of a biodegradable material that is capable of being flushed in the toilet bowl 14. The retention band 484 may also be made of a material that is capable of dissolving in the water when the band 484 and the trapping device 410 are placed in the water of the toilet bowl 14. The retention band 484 may be in the form and/or shape of a round band, a string, or any other shape capable of holding the trapping device 410 in a semi-compressed configuration.

Other compression systems may be utilized without departing from this invention. In another embodiment, the compression system 480 may include clasp. The clasp may attach or hold together the first end 422 and the second end 424 of the strap 420 while installing the trapping device 410 in the toilet bowl. Once the trapping device 410 is installed in the toilet bowl, the clasp may be released, opening the trapping device 410 to an open configuration, and thereby fitting and securing the trapping device in the bottom of the toilet bowl 14.

The size, resiliency, and flexibility of the strap 420 together with the compression system 480 provides the user with the ability to fit the strap 420 and trapping device 410 in to various sized toilet bowls 14, making the trapping device 410 adjustable and universal to many toilet bowls 14. The middle portion 426 may also include a polymer band or strip as described above.

Additionally, the strap 420 may include a front tab 444. The front tab 444 may be located on the front side of the first end 422 or second end 424 and may protrude from the strap 420 perpendicularly. When the trapping device 410 is installed in the toilet bowl 14, the front tab 444 may provide a stop for the trapping device 410 from going down the drain of the toilet bowl 14 and may facilitate proper placement of the device. When installed properly, the front tab 444 may be flush and or directly adjacent to the drain of the toilet bowl 14.

As shown in FIGS. 11-14, the plurality of hooks 460 are cut out of the strap 420 at various locations. In other embodiments of this invention, and as described above, the hooks 460 may be attached to the strap 420 at various locations as well. The hooks 460 are used to catch and retain the non-dispersing cloths, while allowing other materials to pass by. The hooks 460 may be located on the first end 422 of the strap 420, the second end 424 of the strap 420, or middle portion 426 of the strap 420 or any combination thereof. The number and location of the hooks 460 may vary as was described above in the various other embodiments. Additionally, the angle of the hooks 460 may vary as was described above in the various other embodiments. The number, location, and angle of the hooks 460 can vary without departing from at least some examples of this invention.

The hooks 460 may be made of different materials without departing from the scope of the present invention. The hook material should be rigid and inflexible. The hook material should be able to remain substantially in position during toilet bowl cleaning, and if moved from position, return to substantially the same position after the cleaning. Additionally, the hook material should be a non-corrosive material so that the hooks 460 do not rust in the wet environment. Also, the hooks 460 may be sharp, such as sharp enough to catch the non-dispersing cloths and/or other materials, while being able to break or cut through the toilet paper and waste in the toilet 14. Additionally, barbed hooks 460 may be used without departing from at least some examples of the invention. The barbed hooks 460 may have a "T" barb to catch the non-dispersing cloths.

Figure 14A:
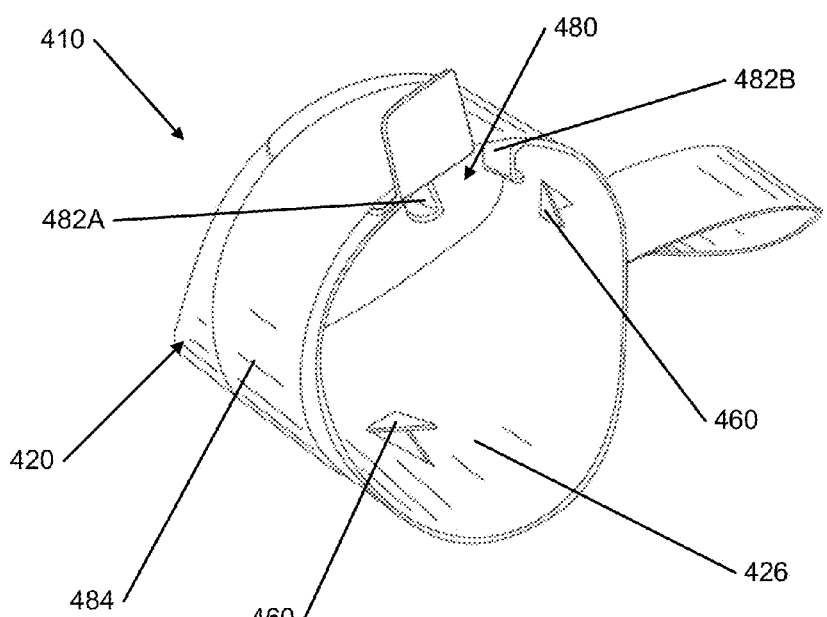
FIGS. 14A through 14F illustrate the installation process of the trapping device from FIG. 11 in accordance with aspects of this invention.

FIGS. 14A through 14F illustrate an example installation of the trapping device 410 in a toilet 14. The trapping device 410, as described above, may be installed in a toilet 14 by a user. To install the trapping device 410, the user may first ensure the trapping device 410 is prepared for installation, as shown in FIG. 14A. To prepare the trapping device 410 for installation, the user must first ensure the retention band 484 is securely around the trapping device 410. The trapping device 410 may include the retention band 484 already in place on the trapping device 410 when the trapping device 410 is purchased by a user. However, in the instance when the trapping device 410 is removed to be cleaned, etc. and then replaced into the toilet 14, the trapping device 410 will not have the retention band 484 in place. As is illustrated in FIG. 14A, the strap 420 of the trapping device 410 is expanded and held together by the retention band 484.

Figure 14B:
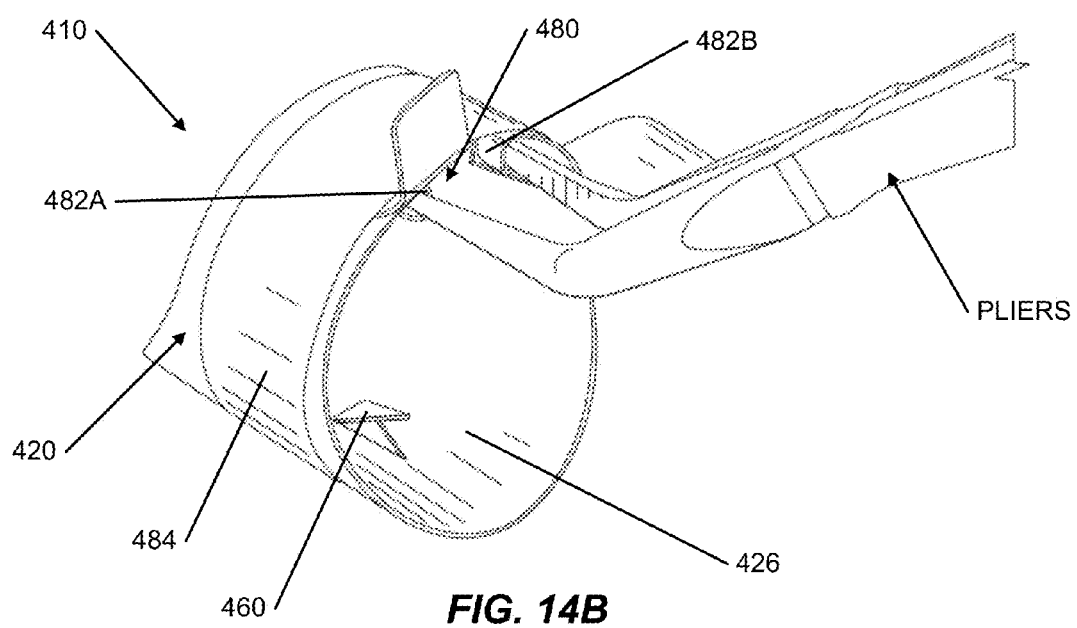

FIG. 14B illustrates the use of a tool, and as shown in these illustrations, a needle-nose pliers. Various other tools may be used to perform these functions without departing from this invention. Additionally, as was discussed above, many different compression devices 480 may be utilized, wherein a tool or external device may not be required to release the strap into the toilet bowl 14 and toilet bowl trapway 12. As illustrated in FIG. 14B, the needle-nose pliers engage the compression system 480 and the tabs 482A and 482B. Additionally, as illustrated in FIG. 14B, the tabs 482A and 482B each may have an additional tab to help the pliers hold onto and engage the tabs 482A and 482B without releasing them or dropping them.

Figure 14C:
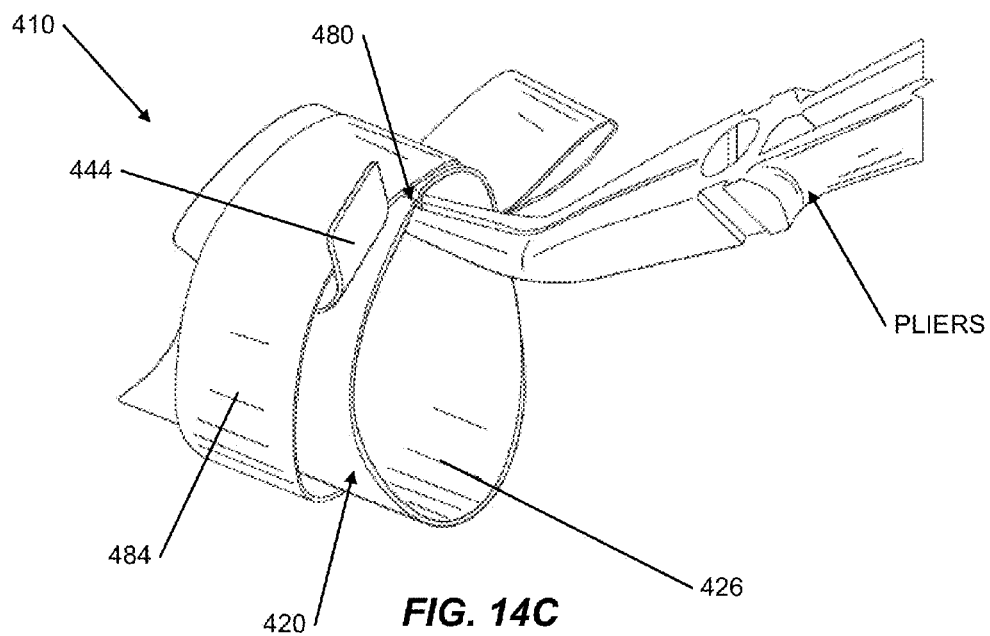
Figure 14D:
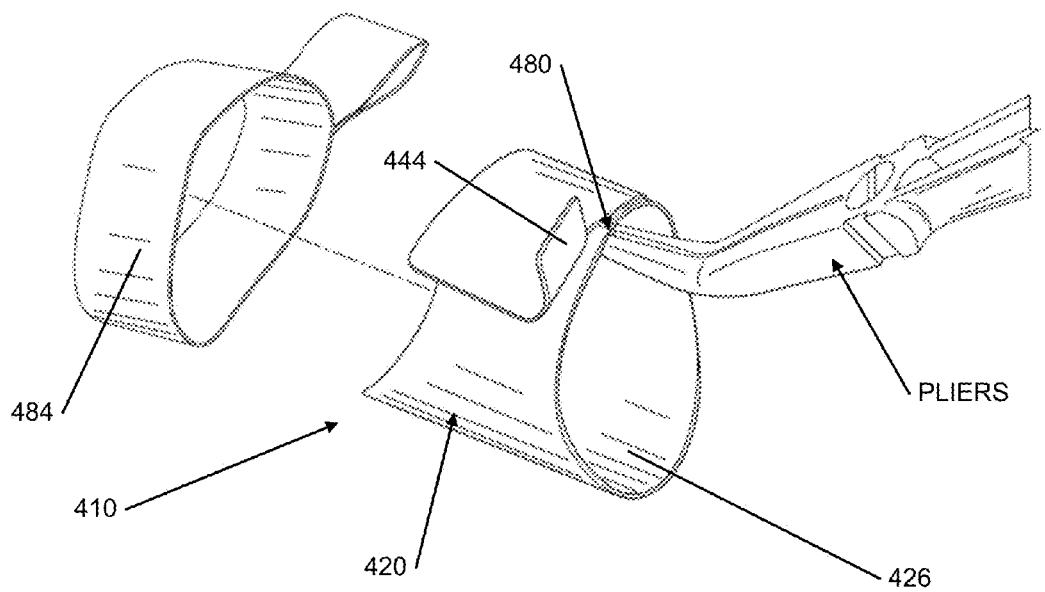

FIG. 14C illustrates the compression of the trapping device 410 and the strap 420 within the retention band 484. As is illustrated in FIG. 14C, the pliers may compress the strap 420 by pulling together the tabs 482A and 482B. By pulling together the tabs 482A and 482B, the strap 420 compresses thereby separating from the retention band 484 and allowing the removal of the retention band 484 from the trapping device 410. FIG. 14D illustrates the removal of the retention band 484 from the trapping device 410. With the trapping device 410 in the compressed configuration, the retention band 484 may be released from the trapping device 410 by sliding the retention band 484 off the strap 420. Additionally, the retention band 484 may be cut, torn, dissolved, from the trapping device, to include various other methods of removing the retention band 484 from the trapping device 410.

Figure 14E:
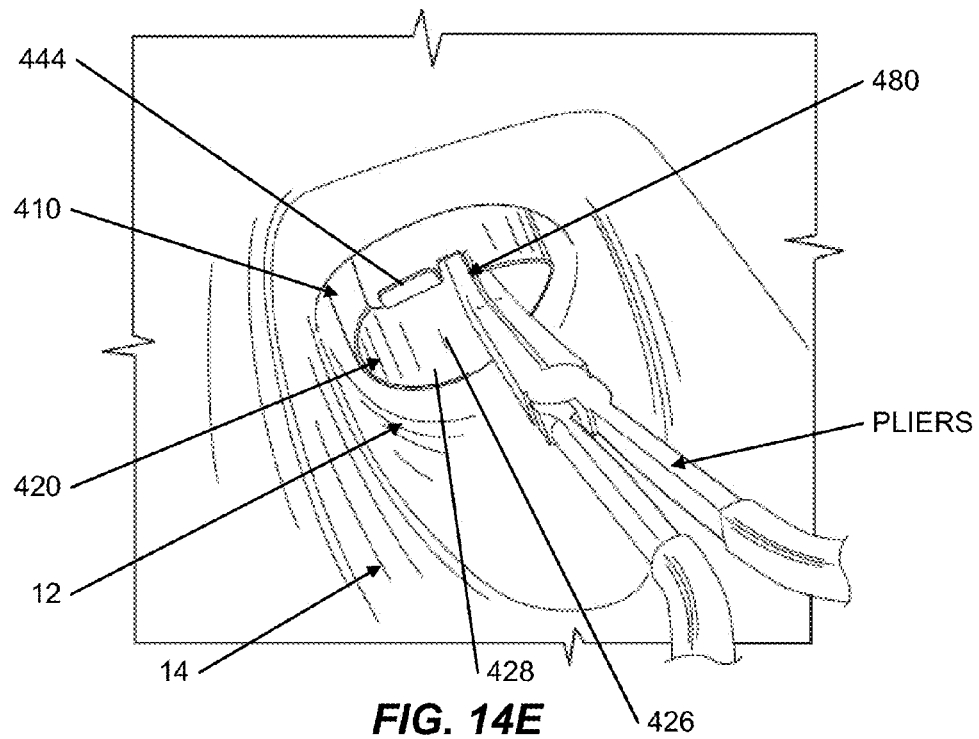
Figure 14F:
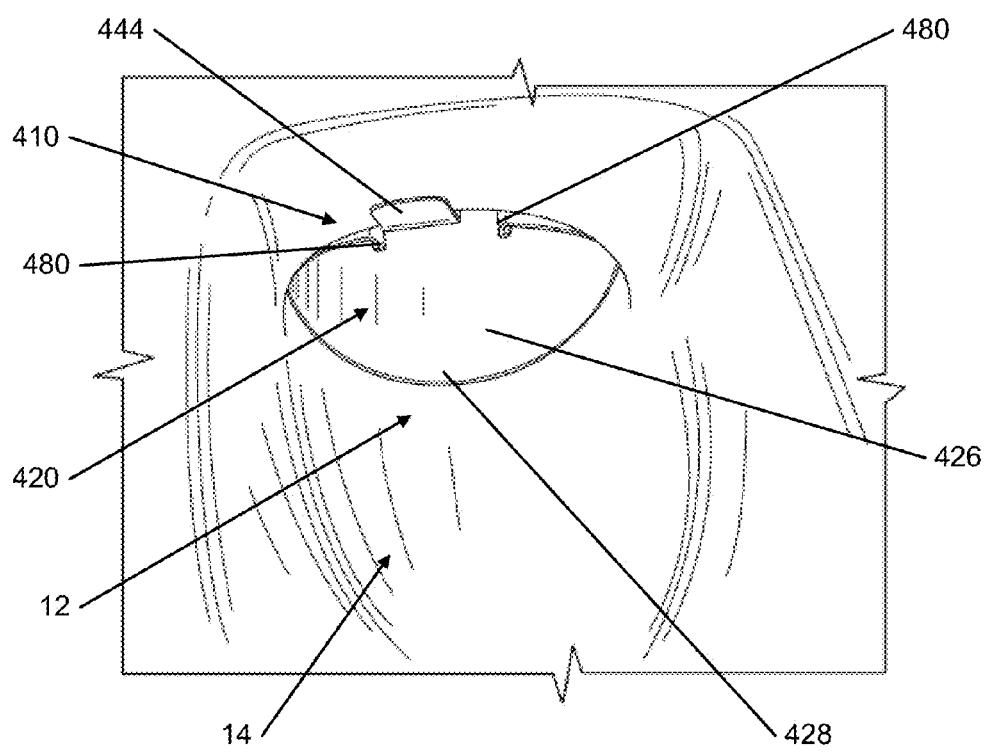

As illustrated in FIGS. 14E and 14F, the user may then install the trapping device 410 into the toilet bowl trapway 12. To install the trapping device 410 into the toilet bowl trapway 12, using the pliers or other tool, the user may first set the trapping device 410 at an angle with the front tab 444 on the top side of the trapping device. Still using the pliers, the user may then slide the trailing edge 430 of the middle portion 426 of the strap 420 into the bottom of the toilet bowl trapway 12. Once the trapping device 410 is set in the correct location in the toilet bowl trapway 12 of the toilet bowl 14, the user may release the pliers from the tabs 482A and 482B, thereby releasing the strap 420. The strap 420 will then expand into the toilet bowl trapway 12 to the correct size and shape. As was described above, other compression systems 480 may be utilized with this invention. For example, a clasp system or an automatic or mechanical release system may be utilized that releases the strap 420 to expand once the trapping device 410 is set and installed in the toilet bowl 14.

With the trapping device 410 installed in the toilet bowl 14, the front tab 444 may be seated against the front portion of the top side of the toilet bowl trapway 12. With the front tab 444 seated in this location on the toilet bowl trapway 12, the trapping device 410 is prevented from being pushed into the drain during normal toilet bowl operations, such as flushing, and normal toilet bowl cleaning. Additionally, the shape of the middle portion 426 of the strap 420, the general football shape, helps prevent the trapping device 410 from being pushed down the drain during normal toilet bowl operations, such as flushing, and normal toilet bowl cleaning. The combination of the front tab 444 and the shape of the middle portion 426 help to keep the trapping device 410 in the proper location throughout the entire flushing process, with water exiting through the drain and water flowing upward after the flush to fill the toilet bowl 14. As illustrated in FIGS. 14E and 14F, the leading edge 428 of the strap 420 may be the only part of the trapping device 410 that the user can see when the trapping device 410 is installed in the toilet bowl 14.

Once installed, the trapping device 410 can also be removed from the toilet bowl 14. The user may need to use pliers or a similar tool to remove the trapping device 410 from the toilet bowl trapway 12 because of the close fit and the front tab 444 engagement with the top of the toilet bowl trapway 12. Additionally, the trapping device 410 may be semi-permanently installed in the toilet bowl 414. This semi-permanent installation may be accomplished by using epoxy or cement or some other glue material without departing from the scope of this invention.

Figure 11:
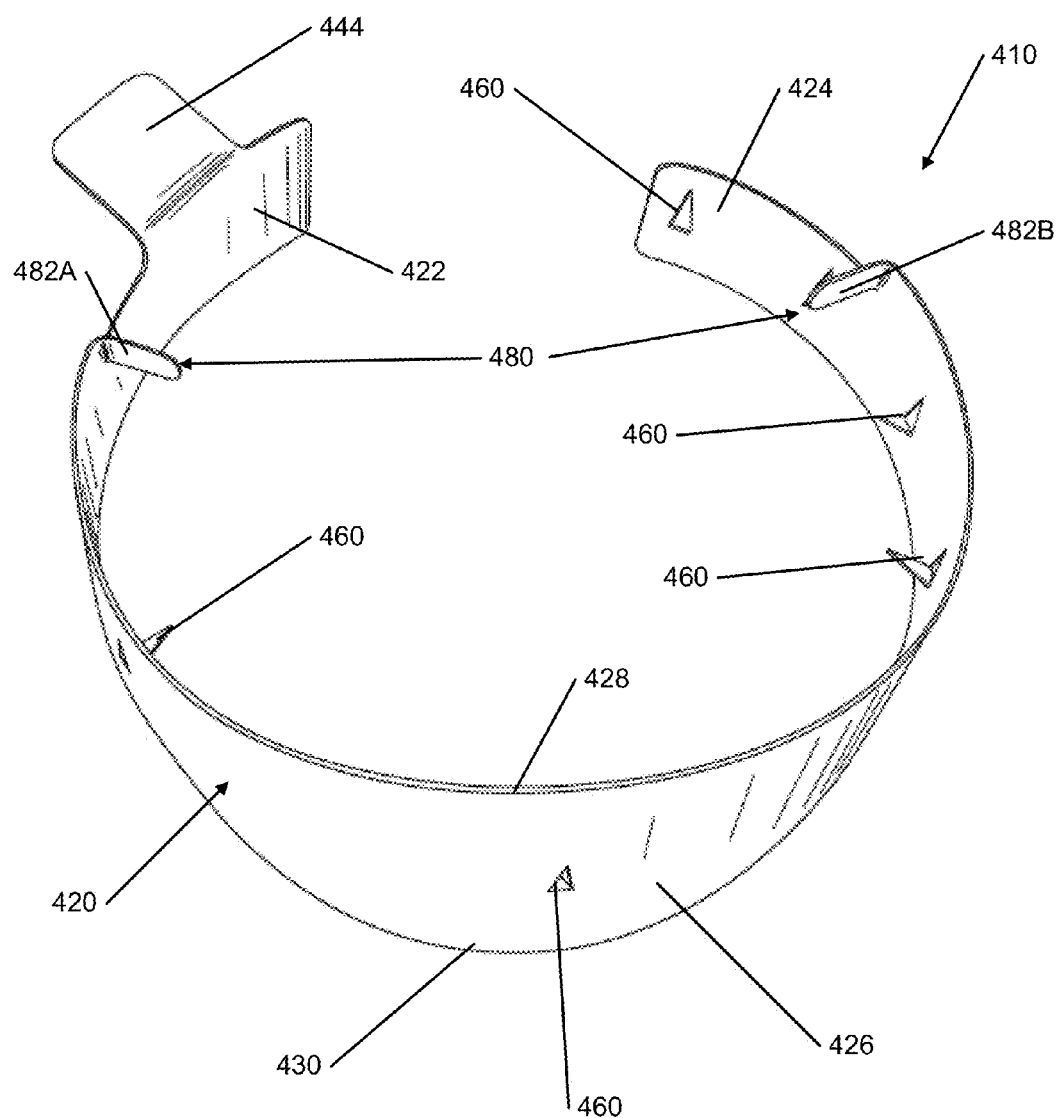
FIG. 11 illustrates a perspective view of another trapping device in expanded configuration for use in a toilet bowl in accordance with aspects of this invention.
Figure 12:
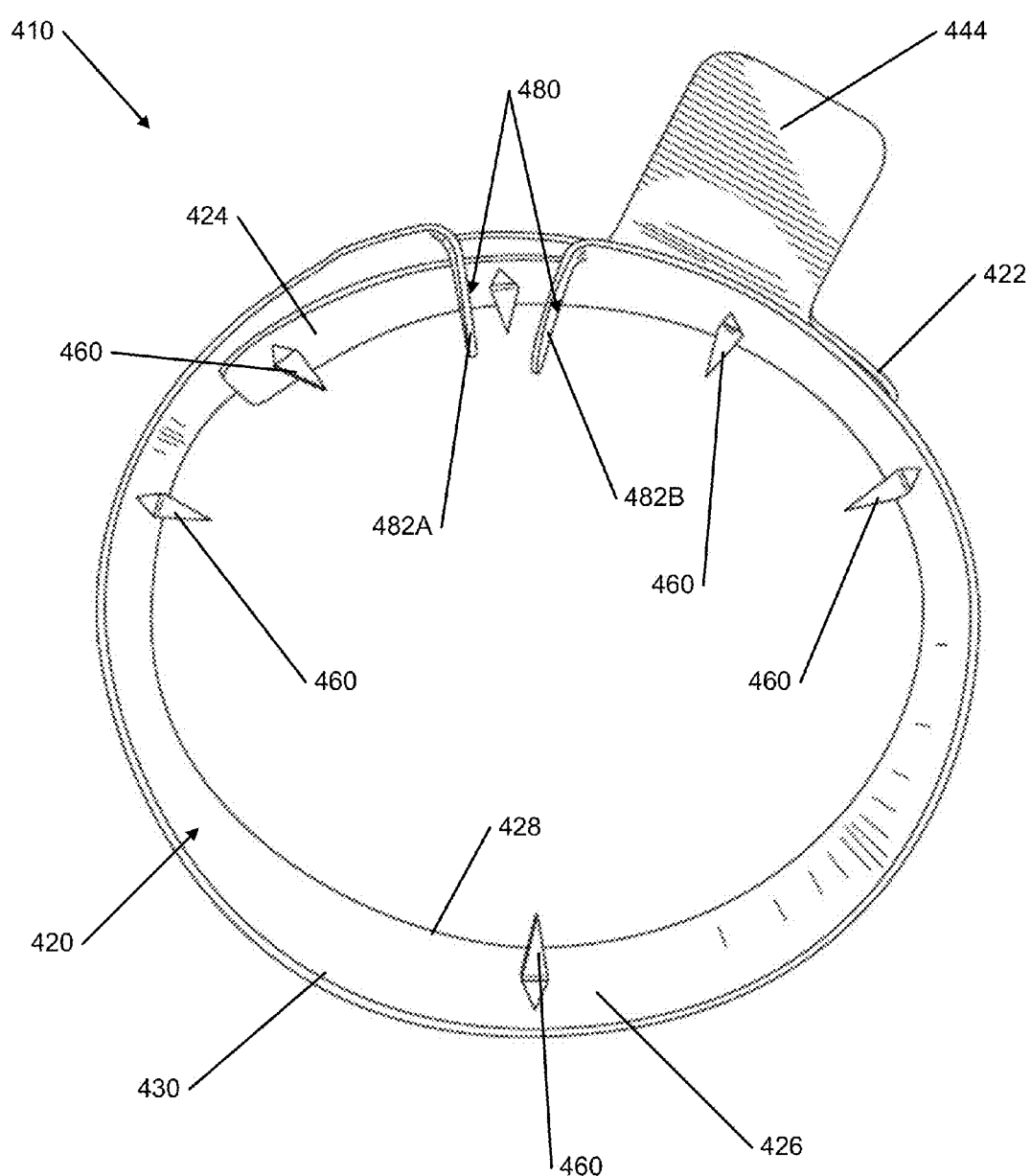
FIG. 12 illustrates the trapping device from FIG. 11 in compressed configuration in accordance with aspects of this invention.
Figure 13:
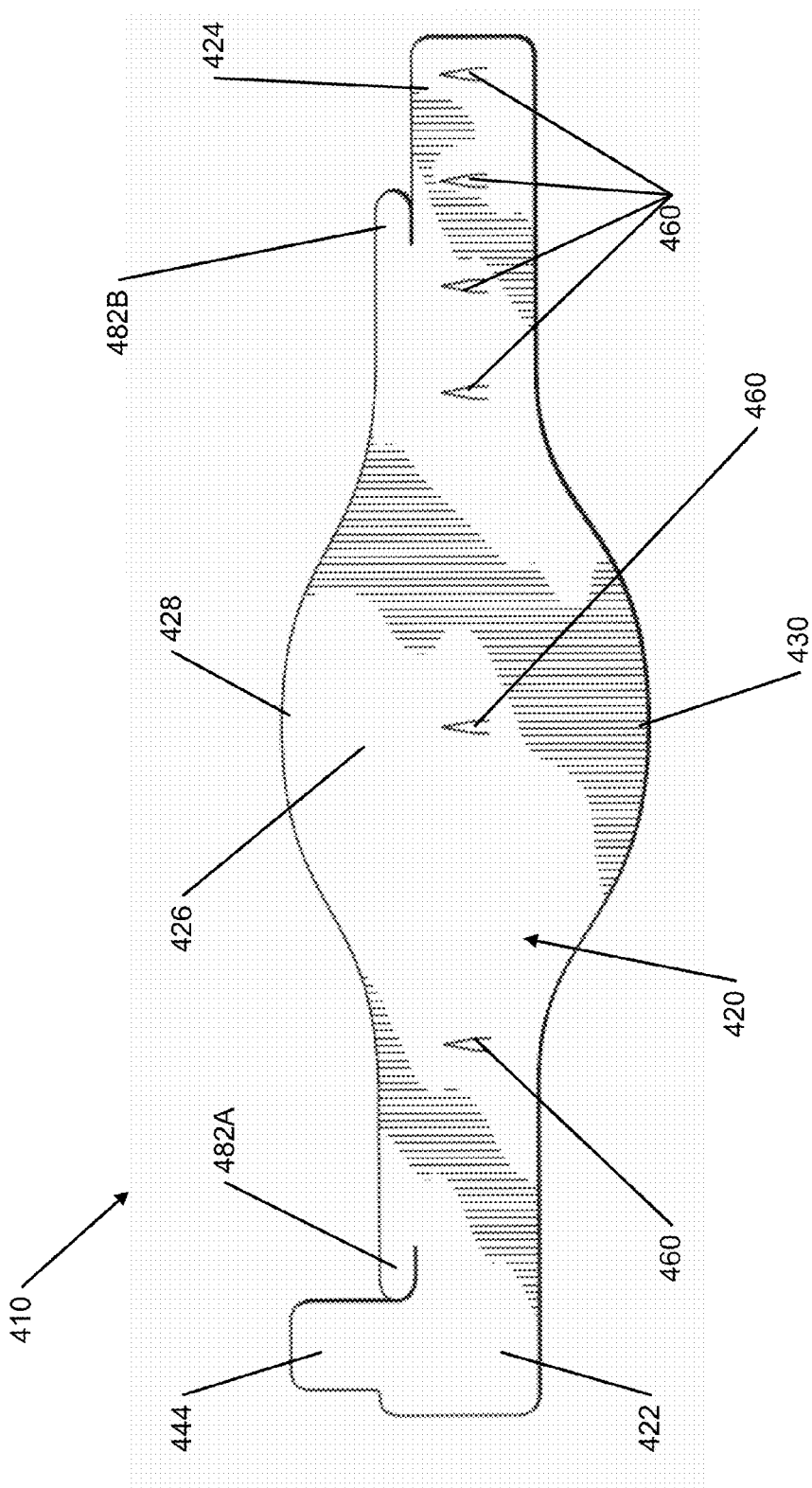
FIG. 13 illustrates the trapping device from FIG. 11 in blank manufactured configuration in accordance with aspects of this invention.
Figure 15:
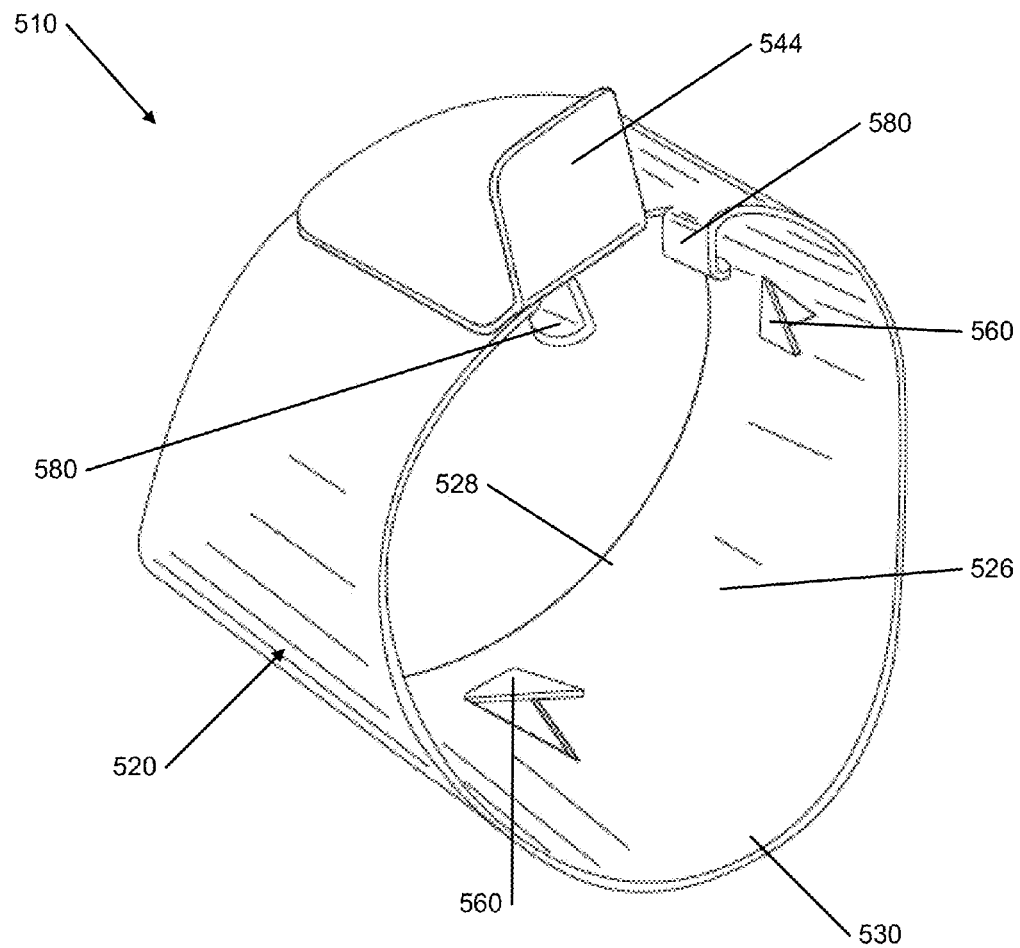
FIG. 15 illustrates another trapping device in accordance with aspects of this invention.
Figure 16:
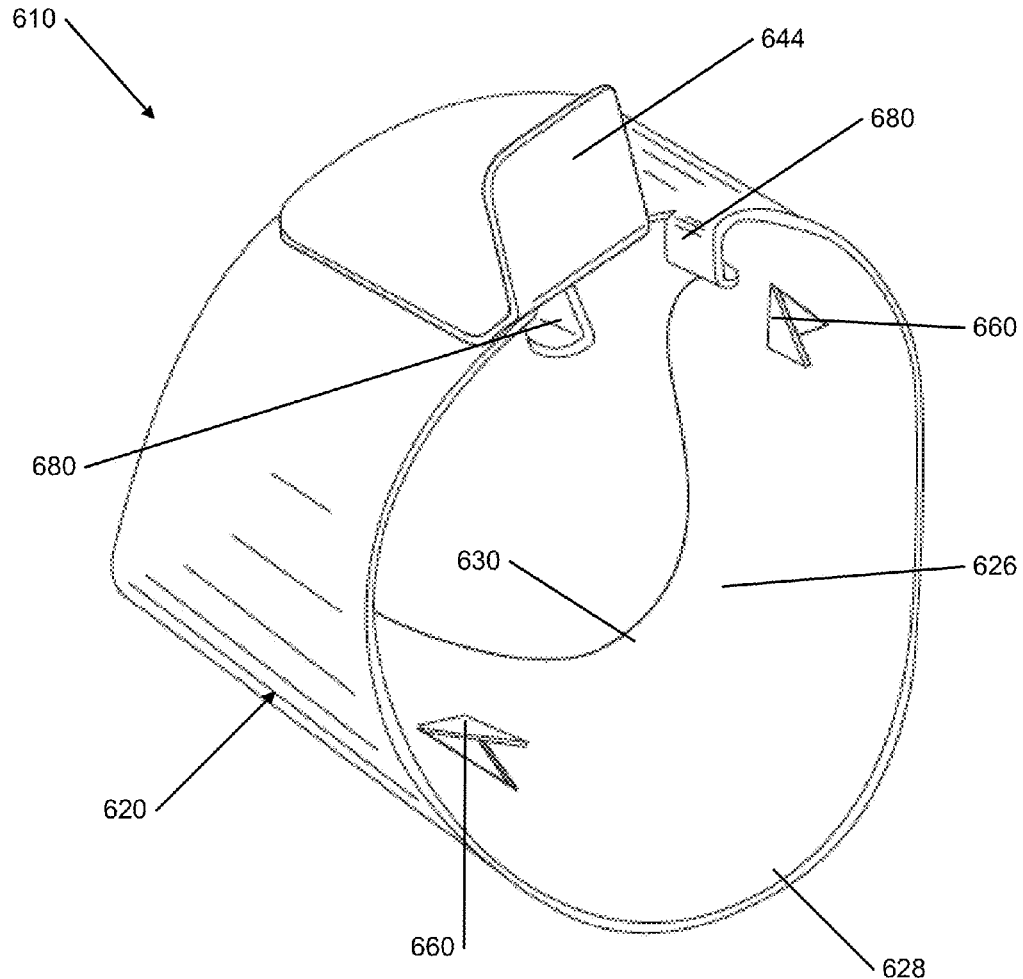
FIG. 16 illustrates another trapping device for use in a jet-assist toilet bowl in accordance with aspects of this invention.

FIGS. 15 and 16 illustrate example combinations according to this invention similar to that described above in conjunction with FIGS. 11-13 (the same or similar reference numbers are used in FIGS. 15 and 16 as those used in FIGS. 11 through 13 to denote the same or similar parts). FIG. 15 illustrates a trapping device 510 wherein the trailing edge 528 is straight instead of the curved edges as illustrated in FIG. 11. FIG. 16 illustrates a trapping device 610 for a toilet bowl with a "jet-assist" housing near the toilet bowl trapway. The jet-assist propels water into the trapway to aid in clearing the toilet bowl. As FIG. 16 illustrates, the jet-assist trapping device 610 may have a section from the middle portion 626 on the trailing edge 630 that is cut away to accommodate the jet-assist housing. Similar to the trapping device 610 described above, the hooks 660 may be located approximately an inch apart. The number, location, and angle of the hooks 660 on the strap 620 can vary without departing from at least some examples of this invention.

Figure 17:
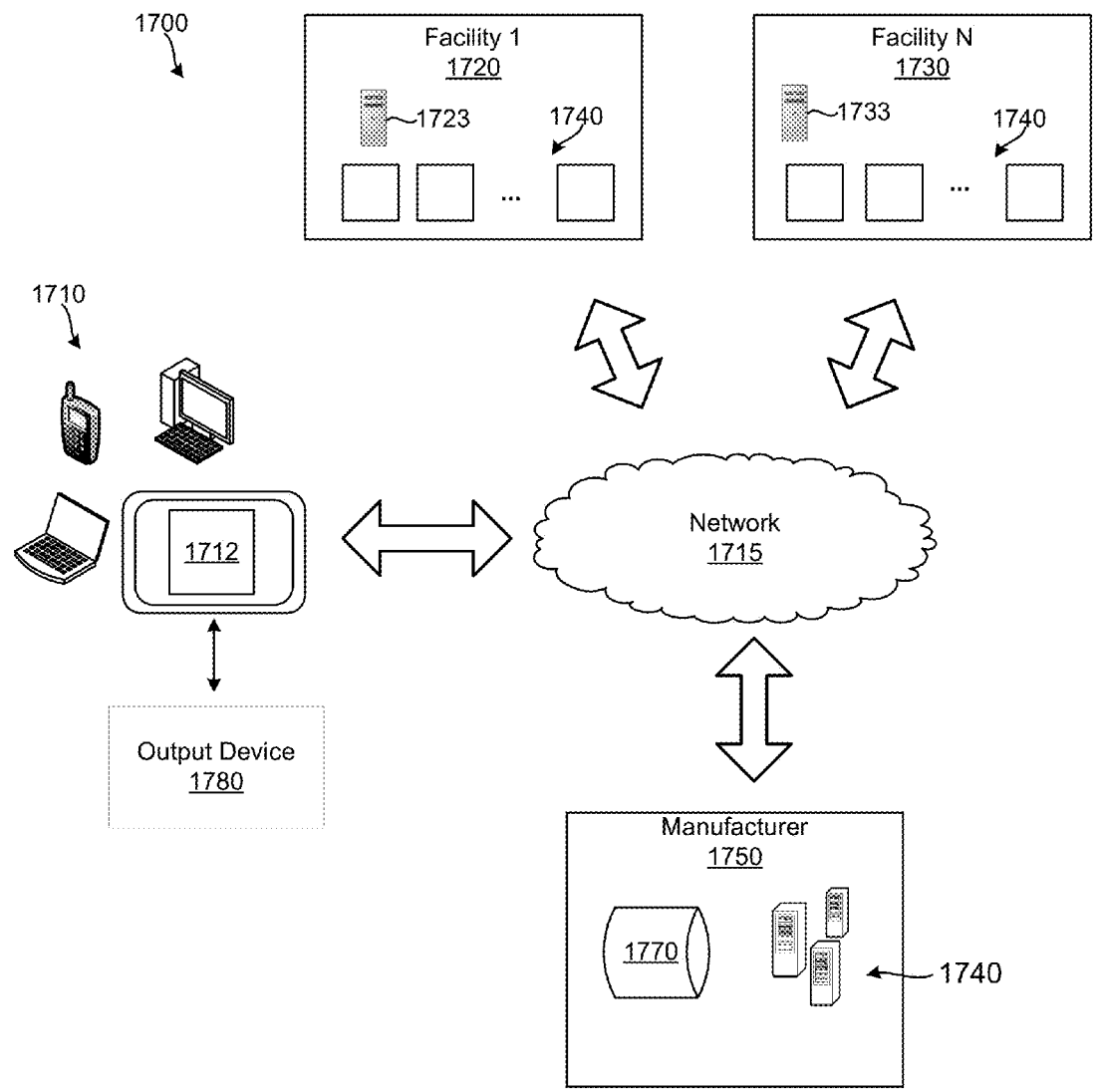
FIG. 17 illustrates a system for sizing the illustrative trapping devices of FIGS. 1A through 16, wherein the trapping devices are for trapping non-dispersing cloths and/or other materials in each of one or more toilets at a facility in accordance with aspects of the illustrative embodiments.

FIG. 17 shows an illustrative system 1700 for sizing the illustrative trapping device(s) (e.g., 10, 210, 410, 510, and 610, etc.) discussed above for trapping non-dispersing cloths in each of one or more toilets and/or hopper sinks at a facility in accordance with aspects of the illustrative embodiments. The system 1700 may include one or more computer devices 1710 that may be communicatively coupled to a network 1715. The network 1715 may be communicatively coupled to one or more devices, such as to servers 1723, 1733, at one or more facilities 1720, 1730. The facilities may include one or more units 1740, which may be used to define a function and/or activity of a certain grouping of rooms at the facility 1720, 1730. For example, the facility 1720 may be a hospital, or other medical institution. The hospital may include one or more different units including, for example, an emergency room (ER), an intensive care unit (ICU), a cardiology unit, a radiology unit, an osteopathic unit, and the like. Further, the computer device 1710 may be communicatively coupled via the network to one or more computing devices (e.g., servers 1760) and/or a data repository 1770 at a facility 1750 associated with a manufacturer and/or supplier of the trapping devices. The network 1715 may include one or more wired and/or wireless networks, such as a telecommunications network (e.g., a cellular network, a land line network, a cable network, etc.), a Wi-Fi network, a local area network (LAN), a wide area network (WAN), the Internet, and the like.

In some cases, the computer device 1710 may include a personal computer, a tablet computer, a laptop computer, a smart phone, or the like. The computer device 1710 may be configured to run an application, such as a trapping device sizing application 1712, which may be configured to specify which trapping device may be used in one or more toilets at the facility 1720, 1730. In some cases, the computer device 1710 may run the trapping device sizing application 1712 locally. In other cases, the computer device 1710 may remotely access the trapping device sizing application 1712 via a network, such as by using a web browser. In such cases, the trapping device sizing application 1712 may run remotely, such as on a server 1760 at a supplier facility 1750. In some cases, one or more of the servers 1760 and/or data repositories 1770 may be used to implement different systems, such as an inventory system, an order fulfillment system, an installation system, a product development and design system, and the like. In some cases, information about model numbers and/or other designations indicative of a trapping device size and/or configuration may be stored in the data repository 1770 and/or stored locally on the computer device 1710. For example, because the size of toilets and/or hopper sinks 14 may vary, even within toilets of the same design provided by a single supplier, the user may need to size the trapping device for each toilet and/or hopper sink at the facility 1720, 1730 to properly fit the trapping device into the trapway 12 of the toilet bowl and/or hopper sink. For example, the trapping device may be shaped differently based on an absence of a jet-assist feature in the trapway, a location of the jet-assist feature in relation to an opening of the trapway, a shape of the trapway (e.g., a number of "corners" in the trapway, and the size of the trapway, and the like. In some cases, the trapping device may be chosen based on a material used to form the toilet and/or hopper sink (e.g., porcelain, stainless steel, etc.), a material used to form the trapping device, and the like. In some cases, certain sizes and/or configurations of toilet and/or hopper sink trapways may be known, such that a specified trapping device model may be associated with each known trapway size and/or configuration. In cases, where a user may encounter a size and/or configuration not associated with a particular trapping device, the computer device 1710 may be used to either choose a particular trapping device that may provide a "best fit". In other cases, the information gathered by the computer device (e.g., measurements, configurations, photographs, etc.) may be used to allow the trapping device manufacturer to generate a new model number and/or design of the trapping device for that particular toilet and/or hopper sink configuration.

In an illustrative example, the system 1700 for sizing a trapping device for trapping non-dispersing cloths and other materials in each of one or more toilets and/or hopper sinks at a facility 1720, 1730 may include the computer device 1710. The computer device 1710 may include a processor and a memory communicatively coupled to the processor. In some cases, the memory may store instructions, that when executed by the processor, may cause the computer device 1710 to solicit information about one or more toilets and/or hopper sinks at the facility 1720, 1730. The information may include at least a size and/or a configuration of a trapway of each of the one or more toilets and/or hopper sinks. The instructions may further cause the computer device 1710 to determine a trapping device for each of the one or more toilets and/or hopper sinks based, at least in part, on the solicited information. The computer device 1710 may further include a communication device coupled to the computer device 1710. The communication device may be configured to communicate information about each trapping device to a customer at the facility 1720, 1730, and/or to a user at the supplier facility 1750. In some cases, the system may further include a manufacturer computer system communicatively coupled to the computer device 1710 via the network 1715. The manufacturer computer system may be configured to generate installation instructions that may be used for installing a specified trapping device in each of the one or more toilets and/or hopper sinks at the facility. For example, the installation instructions may include instructions for use of a compression system configured to hold the trapping device in a rounded semi-compressed configuration and then release the trapping device to a rounded uncompressed configuration when installed in a toilet bowl such that the trapping device fits tightly within the toilet bowl.

Figure 18:
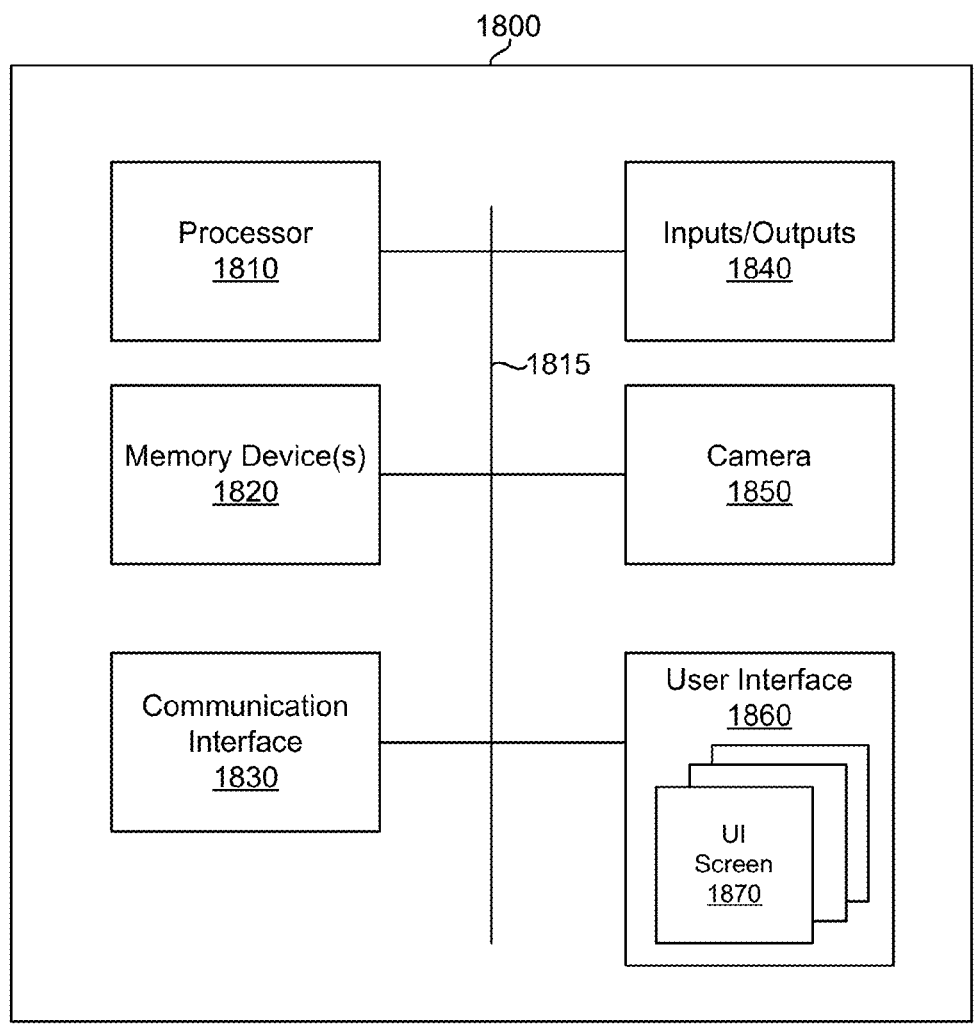
FIG. 18 shows an illustrative system for sizing the illustrative trapping devices of FIGS. 1A through 16 in accordance with aspects of the illustrative embodiments.

FIG. 18 is a partial schematic view of an illustrative computer device 1800, such as the computer device 1710 of FIG. 17. In the illustrative embodiment of FIG. 18, the computer device 1800 may include a processor (e.g. microprocessor, microcontroller, etc.) 1810, one or more memory devices 1820, a communication interface 1830, one or more inputs and/or outputs (I/O) 1840, a camera 1850 and a user interface 1860. The processor 210 may operate by using an algorithm that facilitates the sizing of a trapping device for use in each of one or more toilets and/or hopper sinks at a facility 1720, 1730. This algorithm may be included as instructions stored in one or more of the memory devices 1820 and may be included as a portion of a trapping device sizing application 1712. The processor 1810 may, for example, operate by obtaining information about the size and/or shape of the trapway of each of the toilets and/or hopper sinks and then using the information to determine a model number for a trapping device that may provide a best fit for each particular toilet and/or hopper sink.

In an example, the processor 1810 may be configured to operate the algorithm and/or the trapping device sizing application 1712 using an operating system (e.g., Windows, OS X, iOS, Android, Linux, Unix, GNU, etc.). In some cases, the memory devices 1820 of the illustrative computer device 1800 may be communicatively coupled to the processor 1810, such as via a data bus 1815. The memory devices 1820 may be used to store any desired information, such as the aforementioned algorithm, a lookup table, photographs of known toilet and/or hopper sink configurations, photographs taken by the camera 1850, user interface screens, user information, facility information, and/or the like. The memory devices 1820 may be any suitable type of storage device including, but not limited to, RAM, ROM, EPROM, flash memory, a hard drive, and the like. In some cases, processor 1810 may store information within the memory devices 1820, and may subsequently retrieve the stored information.

In some cases, the computer device 1800 may include a communication interface 1830 for exchanging data with one or more different computing devices (e.g., the server 1760, a facility server, etc.) via a wired and/or wireless link 1126. Such data may include facility information (e.g., a facility name, a facility address, contact information, etc.), unit information (unit name, a number of rooms, a number of toilets and/or hopper sinks, etc.), toilet and/or hopper sink information (e.g., a trapway size a trapway configuration, a material type, a manufacturer name, etc.), trapping device information (e.g., a model number, a size, a configuration, etc.), and/or a report including at least a portion of these data types. The communication interface 1830 depicted in FIG. 18 may include an interface to a local area network (LAN) and/or a wide area network (WAN), but may also include other networks. When used in a LAN networking environment, the computer device 1800 may be connected to the LAN through a network interface or an adapter that may be included as a portion of the communication interface. When used in a WAN networking environment, the computer device 1800 may be connected to or include a modem and/or other means for establishing wired and/or wireless communications over the WAN, such as the Internet. It will be appreciated that the network connections discussed are illustrative and other means of establishing a communications link between the computer device 1800 and the servers 1760 at the supplier site and/or one or more devices at the facility 1720, 1730 may be used. The existence of any of various well-known protocols such as TCP/IP, Ethernet, FTP, HTTP and the like is presumed. In some cases, the trapping device sizing application 1712 may be optionally hosted remotely from the computer device 1800. In such cases, the computer device 1800 may be operated in a client-server configuration to permit a user to optionally retrieve web pages from a web-based server.

In some cases, as illustrated in FIG. 18, the computer device 1800 may include the I/O 1840. The I/O 1840 may include a data port (e.g., a wireless port) that may be configured for communication using a protocol, such as a Bluetooth™, Wi-Fi 33, Zigbee or any other wireless protocol. In other cases, data port may be a wired port such as a serial port, an ARCNET port, a parallel port, a serial port, a CATS port, a USB (universal serial bus) port, and/or the like. In some cases, the data port of the I/O 1840 may use one or more communication protocols, such as Ethernet, etc., that may be used via a wired network or a wireless network. In some instances, the I/O 1840 may include a USB port and may be used to download and/or upload information from a USB flash drive or some other data source. Other remote devices may also be employed, as desired.

The I/O 1840 may be configured to communicate with the processor 1810 and may, if desired, be used to upload information for use by the processor 1810 and/or download information from the processor 1810. Information that can be uploaded and/or downloaded may include, for example, values of operating parameters, configurations, model numbers, lookup tables, and the like. In some instances, the I/O 1840 may be used to upload a previously-created toilet configuration, picture of the previously created toilet and/or hopper sink configuration, and/or a model number of a trapping device for use with the previously created toilet and/or hopper sink configuration, thereby hastening the sizing process. In some cases, the I/O 1840 may be used to download data stored within the memory devices 1820. For example, the I/O 1840 may be used to download a toilet and/or hopper sink configuration and/or a facility report that has been created using the computer device 1800. Such reports may be used as a record of trapping devices to be installed at the particular facility 1720, 1730. In some cases, the I/O 1840 may be used to upload and/or download information pertaining to installation of one or more trapping devices, if desired. The reports, or other information may be downloaded to a device such as a USB memory stick (also sometimes referred to as a thumb drive or jump drive), a personal computer, laptop, iPAD® or other tablet computer, a PDA, a smart phone, or other device, as desired. In some cases, the data may optionally be convertible to an MS EXCEL®, MS WORD®, text, XML, MySQL, and/or Adobe PDF® file and other data base formats.

In some cases, the camera 1850 may be used for taking a photograph of a toilet and/or hopper sink, such as to provide a visual record of the trapway configuration for that particular toilet and/or hopper sink, or to be used to auto-size the particular toilet and/or hopper sink. For example, the facility 1720, 1730 may include one or more toilets and/or hopper sinks of a manufacturer and/or having a configuration not previously encountered. Because of variances in toilet and/or hopper sink manufacture, model numbers associated with particular trapping device sizes and/or configurations may be associated with commonly encountered toilets and/or hopper sinks. When an unknown toilet and/or hopper sink manufacturer and/or a different trapway size and/or configuration is encountered, the user may desire to photograph, or otherwise record, details about the particular toilet and/or hopper sink. Using that information, a new model number may be generated and be associated with the newly encountered toilet and/or trapway configuration that may provide a "best fit" for the particular trapway.

In the illustrative embodiment of FIG. 18 the user interface 1860 may be any suitable use interface that permits the computer device 1800 to display and/or solicit information, as well as accept one or more user interactions with a user. For example, the user interface 1860 may permit a user to enter data such as a facility name, contact information associated with the facility, unit information, room information, a toilet configuration, a trapway configuration, and the like. In some cases, the user interface 1860 may include a display and a distinct keypad. In some cases, the user interface 1860 may include a display and a virtual keypad. A display may be any suitable display. In some instances, the display may include or may be a liquid crystal display (LCD), and in some cases a fixed segment display or a dot matrix LCD display. If desired, the user interface 1860 may be a touch screen LCD panel that functions as both display and keypad. In some instances, a touch screen LCD panel may be adapted to solicit information from a user and/or to receive such information. The user interface 1860 may be adapted to display one or more user interface screens 1870. For example, the trapping device sizing application 1712 may be configured to solicit and/or present information to a user via the one or more use interface screens 1870. Illustrative user interface screens 1870 are shown in FIGS. 19-24.

In an illustrative example, the computer device 1800 may be used for sizing one or more trapping devices for use at a facility 1720, where each trapping device may be for trapping non-dispersing cloths and/or other materials in a toilet bowl and/or hopper sink. As discussed above, the computer device 1800 may include one or more processors (e.g., the processor 1810) and one or more memory device 1820. The memory devices may be communicatively coupled to the processor, and other components of the computer device 1800, via the data bus 1815. The memory devices may be configured to store instructions, that when executed by the processor, cause the apparatus to determine a configuration of a trapway for each of one or more toilet bowls and/or hopper sinks at a facility and to determine a size of a trapping device corresponding to the determined configuration of each of the one or more trapways. In some cases, the computer device may include a user interface 1860 in communication with the memory devices 1820 and the processor 1810. The user interface 1860 may be configured to gather about the one or more trapways of the toilets and/or hopper sinks at the facility. In some cases, the user interface 1860 may present one or more user interface screens 1870 to the user to facilitate the information gathering. The user interface screens 1870 may be stored, at least in part, in the memory devices 1820. In some cases, the computer device 1710 may be configured to process instructions for generating a report including information about one or more trapping devices to be installed at a consumer facility. The computer device may use the communication interface 1830 and/or the I/O 1840 to communicate the report, or other information, to a user. For example, the computer device 1800 may communicate the report to a consumer at the customer facility and/or to a user at a supplier facility 1750. In some cases, the computer device 1810 may allow a user to download the report, or other information (e.g., new toilet configuration information, photographs, etc.) via the I/O 1840, such as to a USB device. In some cases, the system 1700 may include an output device 1780, such as a printer. The output device 1780 may be configured to communicate to the computer device 1710 and output information from the trapping device sizing application 1712, such as a report, a photograph, or the like.

FIGS. 19-24 show illustrative user interface screens to facilitate sizing of the illustrative trapping devices of FIGS. 1A through 16 in accordance with aspects of the illustrative embodiments. For example, the trapping device sizing application 1712 discussed above may be implemented using one or more user interface screens. These user interface screens may be presented to a user via a user interface, such as the user interface 1860 of the computer device 1800. For example, the trapping device sizing application 1712 may be written as an application, or other program, running on a computer device, such as a tablet computer, laptop computer, smart phone, or the like. In some cases, the trapping device sizing application 1712 may be run at a central location, such as the server 1760 at a trapping device supplier facility 1750. In such cases, the user interface screens 1870 may be accessed via an application (e.g., a browser) on the computer device 1800.

Figures 19, 20:
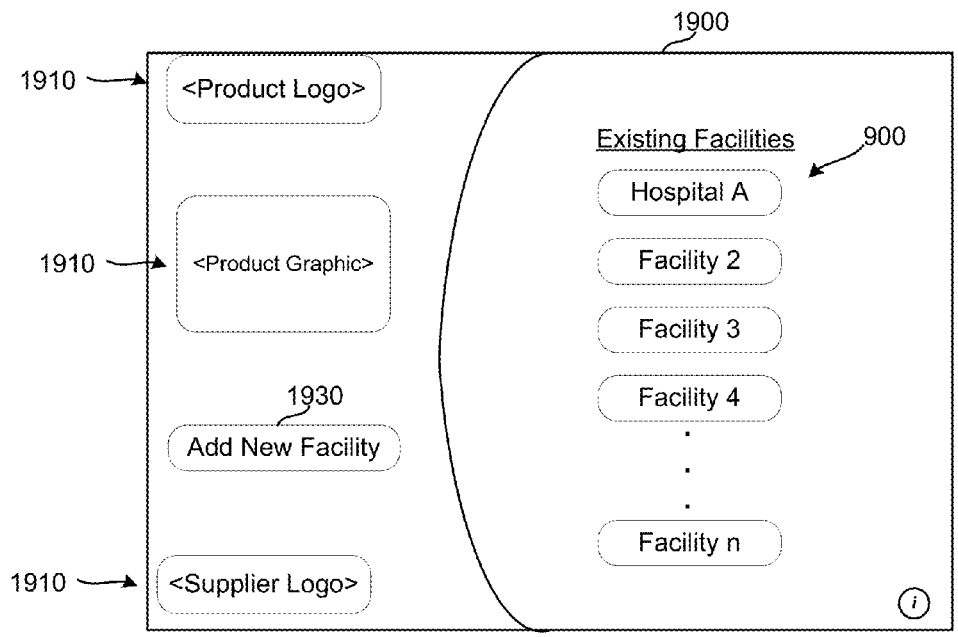
FIGS. 19-24 show illustrative user interface screens to facilitate sizing of the illustrative trapping devices of FIGS. 1A through 16 in accordance with aspects of the illustrative embodiments.

The trapping device sizing application 1712 may include a home screen, such as the home screen 1900 of FIG. 19. The home screen may include supplier and/or product information 1910 and one or more customer links 1920. For example, the supplier and/or product information 1910 may provide a static display of the supplier and/or product name such as to present branding information to a user. In some cases, the supplier and/or product information 1910 may include a clickable link to a supplier and/or product website. By clicking the link, the computer device 1800 may navigate to a website indicated by the link, where the website provides further information about the supplier and/or products to the user. In some cases, the clickable links may link to information stored locally to the computer device 1800. When the links are selected by the user, the trapping device sizing application 1712 may present supplemental supplier and/or product information to the user via a user interface screen that is included in the trapping device sizing application 1712. In other cases, a separate application, such as a web browser, may be caused to open to present any linked information. The customer links 1920 may be presented to the user via any number of ways, such as a list of clickable links, a series of buttons, in a tabular format, a drop down menu, and the like. When selected, the customer link 1920 may cause a user interface screen associated with a particular customer site to open. The home screen may also include a button 1930 to allow a user to add a new customer facility to the customer links 1920. For example, a user may select an "add new facility" button to open a user interface screen associated with a new customer site. After saving the new customer information, the newly added customer site may be included as part of the customer links 1920.

FIG. 20 shows an illustrative facility information screen 2000 that may be used for entering and/or editing customer site information. For example, the facility information screen may include a facility name field 2010, a contact information field 2020 and a location field 2030. These fields may allow a user to enter facility name and contact information of one or more persons associated with the facility. The contact information field 2020 may allow entry of a name, phone number, email address and the like for one or more people associated with that particular facility, such as for a primary contact and a secondary contact. The location field may allow entry of a location associated with the facility, such as a city name. In some cases, the location field may allow entry of a complete or partial address of the facility. The facility information screen, among others, may include menu buttons 2040 that may allow a user to navigate and/or otherwise interact with the trapping device sizing application 1712. For example, the menu buttons 2040 may include a home button, a support button, and one or more editing buttons. For example, the home button, when selected, may allow a use to navigate to the home screen of FIG. 19. The support button may allow a user to receive support in determining the size and/or configuration of the trapping devices used at the facility, and/or installing the specified trapping devices. In some cases, the support screen may include a link to a support website associated with the supplier of the trapping devices and/or links to different toilet vendor website. An illustrative support screen is discussed below in reference to FIG. 24. Other buttons may include, for example, a 'Delete' button for deleting the entry, a 'Cancel' button for canceling any edits to the facility information, and/or a 'Done' button for saving and/or closing the facility entry screen. In some cases, one or more other buttons may be contemplated, such as a save button or a 'Survey' button 2032. In some instances, when finished entering the facility information, the user may select the 'Done' button to navigate to a different user interface screen, such as the home screen 1900 or a user interface screen (e.g., the facility screen 2100) associated with the newly entered facility.

In some cases, when selected, the survey button 2032 may cause one or more user interface screens to be displayed for facilitating entry of a survey, such as the illustrative user interface screens 2700, 2800, 2900, and 3000. In some cases, the survey may be associated with a particular facility. For example, when a user enters and/or edits a user facility via the facility information screen 2000, an instance of the survey will be created and stored by the memory devices 1820. The stored survey may include a reference to the facility for which the instance was created.

Turning to FIG. 2000 which shows an illustrative first survey screen 2700 for presentation of a survey. In some cases, an objective of the survey may be to facilitate a determination of a return on investment (ROI) for installing the trapping device at one or more toilets and/or hopper sinks against having clogs in the facility. For example, the first survey screen 2700 may include a question section 2710 for gathering information about a number of toilets and/or hopper sinks at a facility, an approximation of a number of maintenance calls received within a specified time period (e.g., a month, a week, etc.), an approximate percentage of the number of maintenance calls related to a flushing issue and/or clog. In some cases, the question section may further ask a user to enter information as to a cause of one or more clogs at the facility. For example, the user may be prompted to enter an approximate percentage of clogs caused by different products and/or classes of products. For example, a clog may be formed when non dispersing cloths, such as environmental wipes, disposable bathing and/or incontinence wipes, reusable cotton washcloths, paper towels, and/or other non-dispersing materials (e.g., underpads, diapers, gloves, gauze, pens, etc.) are flushed down a toilet or hopper sink. In some cases, the survey screens of FIGS. 27-30 may be separate and/or distinct user interface screens which may be navigated by a user via navigation buttons 2712. In other cases, the survey screens illustrated in FIGS. 27-30 may correspond to a single user interface screen (e.g., a multi-page user interface screen) which may be navigated by a user via a scroll bar or other user interface control, or a combination of separate user interface screens and a multi-page user interface screen.

FIGS. 28-30 show another illustrative user interface screens 2800, 2900, and 3000 that may include further survey questions about the facility. For example, the survey may gather information about whether a room at the facility had been shut down and/or a patient had been moved due to a clog. If so, other questions may be answered to gather further information. For example, the survey may ask questions about how many times a room has been shut down, such as over a specified time period (e.g., a month, 6 months, a week, a year, etc.). In some cases, the survey may ask which unit at the facility has the highest frequency of room closures due to clogs and/or how many toilets and/or hopper sinks are associated with the unit. In some cases, the survey may ask about an average cost to the facility due to a room shut down, such as a cost due to lost revenue, equipment rental, environmental services, electrical work, infection control, drywall and/or tile repair, plumbing services, outside contractor services, patient dissatisfaction and/or other costs which may be enumerated by the user. In some cases, the survey questions may be shown on a single survey screen. In other cases, the survey questions may be split between different screens, such as question 4 (e.g., section 2810) of FIGS. 28 and 29, and question 5 of FIGS. 29 and 30 (e.g., section 2910). The survey may further prompt a user for information about clogs seen at a unit level of the facility, such as in section 2910 (e.g., question 5). For example, the user may be prompted as to whether a unit had ever been shut down due to clogs. If so, the user may answer a series of questions about how many times has the unit been shut down over a period of time (e.g., 3 months, 6 months, a year, etc.), which unit(s) were affected, how many toilets and/or hoppers associated with the unit(s), and/or an average total cost associated with shutting down a unit. As before, the costs for shutting the unit may be classified as to a number of categories, such as lost revenue, equipment rental, environmental services, electrical work, infection control, drywall and/or tile repair, plumbing services, outside contractor services, patient dissatisfaction and/or other costs which may be enumerated by the user. In many cases, the survey information may be communicated to a supplier and/or manufacturer site separate from the trapping device order information. In other cases, at least a portion of the survey information may be associated with at least a portion of the trapping device order information. For example, survey information and trapping device order information, both associated with a particular unit or units of the facility, may be communicated together to the supplier and/or manufacturer.

Returning to FIGS. 21A and 21B, which show illustrative user interface screens, such as the facility screens 2100, 2150 for editing information about a particular facility. For example, the user may have created new facility named "Hospital A". Hospital A may include at least one unit. Each unit may include one or more rooms. In some cases, one or more of the rooms may include an associated toilet in which a trapping device is desired to be installed. The facility screen 2100 may include a unit field 2110 to facilitate entry of one or more units 1740 of the particular facility, such as an intensive care unit (ICU) 2111. To facilitate entry of the different units in the unit field 2110, the facility screen 2100 may include a button 2115 to allow a user enter a new unit 2112 into the unit field 2110. The user interface screen may also include a comment button 2120. The comment button 2120 may allow a user to enter information to be associated with a particular customer facility. For example, a user comment screen may open and include a text window, so that the user may enter a narrative or other description of the particular customer facility (e.g., Hospital A). In some cases, the user may be capable of embedding or otherwise associating one or more pictures with the facility information.

The facility screen 2100 may include a unit field 2030 that may be used to enter the sizing information about one or more toilets and/or hopper sinks included in a particular unit, such as the ICU 2111. In some cases, the unit field 2030 may include an add button 2105 that may be used to enter information about a number of toilets and/or hopper sinks within the ICU 2111. For example, a number of rooms within the unit may include toilets and/or hopper sinks having the same and/or similar characteristics. The trapping device sizing application 1712 may allow the rooms having similar toilets and/or hopper sinks to be grouped together. For example, room numbers having similar toilets and/or hopper sinks may be added in a room field. The user may then be allowed to choose a jet type, an opening type and a size associated with the trapways of the toilets and/or hopper sinks in this group. The user may also be allowed to specify a style of toilet and/or hopper sink, such as by selecting whether the toilets are hopper-style toilets. Once entered, the trapping device sizing application 1712 may then display a model number of a trapping device that provides the 'best fit' for the group of toilets and/or hopper sinks, where the trapping device sizing application 1712 determines the model number based, at least in part, on the jet information, opening information, size information and style information defined in the unit field. If desired, a user may associate photographs of the toilet and/or toilet trapway via the unit field 2030 of the facility screen 2100. For example, the user may select a button, such as the camera button 2140, to take and/or view photographs associated with a particular toilet and/or hopper sink design.

Figure 21A:
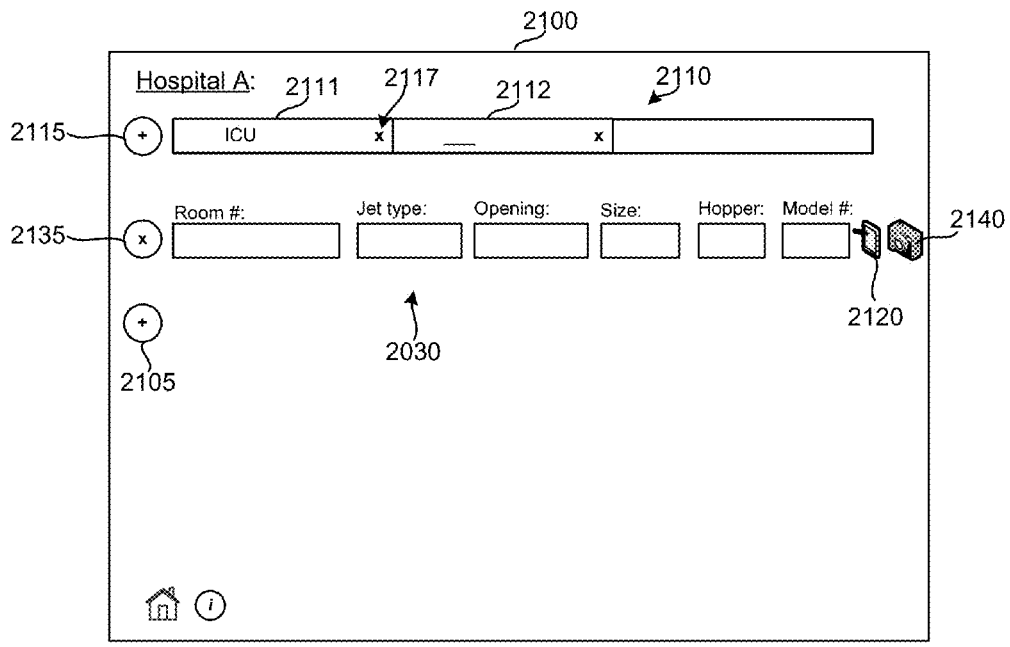
Figure 21B:
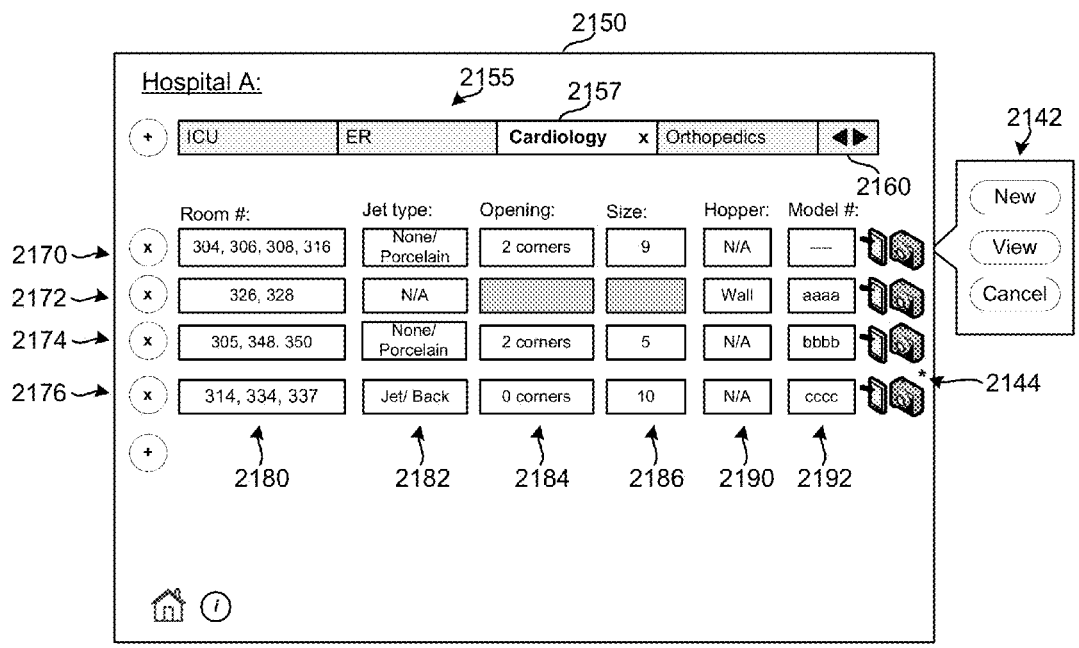

FIG. 21B shows an illustrative facility screen 2150 for a facility (e.g., "Hospital A") having a number of units 2055, such as the units 1740. The user may select a particular unit (e.g., the "Cardiology" unit) in the unit field 2110 via the user interface of the computer device 1710. In some cases, a facility may include more units than can be displayed at the same time in the unit field 2110. In such cases, the user may scroll through the units by using one or more navigation buttons 2160, by swiping a finger across a touch screen adjacent to the unit field 2110, or by using another similar method. Each unit may include a number of rooms that contain a toilet and/or hopper sink. In some cases, two or more of the toilets and/or hopper sinks may share a similar design, a similar trapway size and/or a similar trapway configuration. In such cases, the similar toilets and/or hopper sinks may be grouped, such that a particular trapping device may be specified for each particular toilet. In the illustrative example of FIG. 21B, a number of different toilet and/or hopper sink designs and/or configurations may have been recognized between the toilets and/or hopper sinks of the different rooms and may be displayed in a tabular format. In a first row 2170, a number of rooms (e.g., room numbers 304, 306, 308, and 316) have been associated in column 2180 with a toilet and/or hopper sink having a first configuration defined in columns 2182-2190. Row 2172 includes different rooms (e.g., room numbers 326, 238) that have been associated with a second toilet and/or hopper sink configuration, row 2174 includes a number of rooms (e.g., room numbers 305, 348, and 350) that have been associated with a third toilet and/or hopper sink configuration, and a number of rooms (e.g., room numbers 314, 334, 337) have been associated with a fourth toilet and/or hopper sink configuration. When the toilet and/or hopper sink configuration has been defined the columns 2182-2190, the trapping device sizing application 1712 may be configured to use the configuration information to determine a model number 2192 or other indication of a trapping device that would best fit the trapway of the particular toilet and/or hopper sink. In some cases, the trapping device sizing application 1712 may use an algorithm and/or a look-up table when determining which trapping device would fit the particular trapway.

Figure 22A:
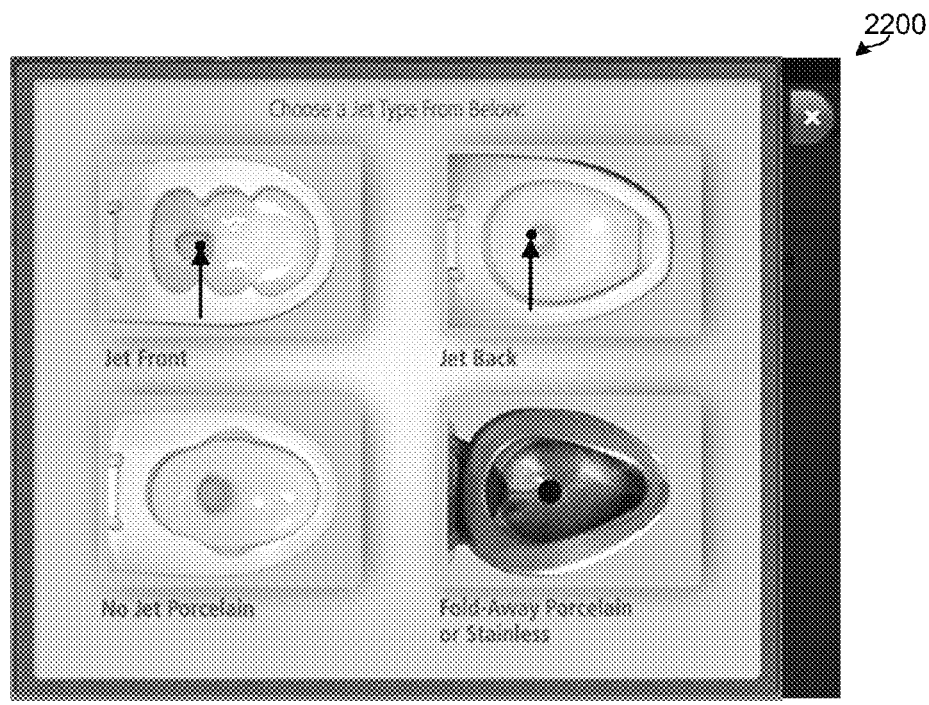
Figure 22B:
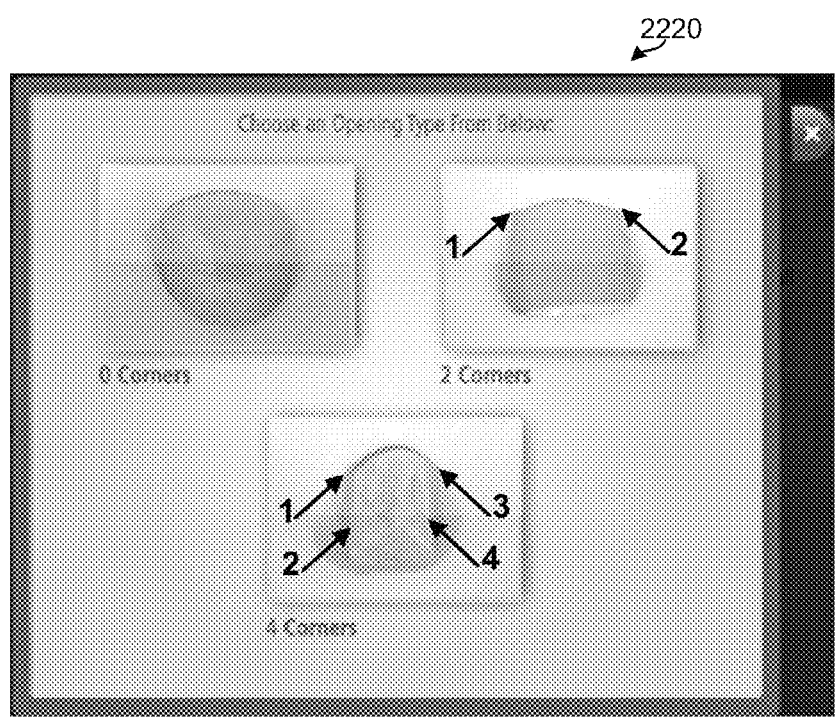

For example, a user may enter this information into the trapping device sizing application 1712 by examining each toilet and/or hopper sink individually to determine one or more characteristics about each toilet and/or hopper sink. Once a toilet and/or hopper sink has been inspected, the room number of the particular toilet and/or hopper sink can be entered. For example, the user may inspect a first toilet and/or hopper sink in room 304 and identify a particular trapway configuration and/or a trapway size of the toilet and/or hopper sink. The user may then enter this information into the trapping device sizing application 1712 via the facility screen 2150, 2150. In some cases, the trapping device sizing application 1712 may be configured to present the toilet and/or hopper sink configuration information graphically via a photograph, textually via a drop down menu, and/or another similar method. In some cases, the user may be capable of entering the configuration information manually. For example, when a user selects a field in columns 2182-2190, a drop down menu may appear. The drop down menu may include a number of selectable options. For example, in the "jet type" column 2182, the user may be able to select from a number of choices which may include: (1) a front jet, (2) a back jet, and (3) no jet. In some cases, a material type of the particular toilet may be selectable. For example, a separate column may exist to allow a user to select from a toilet and/or hopper sink material including porcelain and stainless steel. In some cases, these material selections may be included as part of another configuration setting. For example, the jet type column 2182 may include options such as (1) front jet, porcelain, (2) back jet, porcelain, (3) no jet, porcelain, and/or (4) fold away porcelain or stainless steel. In some cases, the trapping device sizing application 1712, may allow a user to select a toilet configuration graphically. For example, when the "jet type" field is selected for a particular toilet and/or hopper sink style, a new window, or other similar user interface screen, may appear. In FIG. 22A, the different configuration options may be presented graphically in a toilet and/or hopper sink configuration screen 2200. For example, for jet-assist equipped toilets and/or hopper sinks, the location of the jet may be indicated on a picture and/or a diagram of the toilet and/or hopper sink. Further, a toilet and/or hopper sink material may be graphically represented in the toilet and/or hopper sink configuration screen 2200 either as a photograph of an illustrative toilet and/or hopper sink or as shading on a diagram of an illustrative toilet and/or hopper sink. In some cases, the user may view the toilet and/or hopper sink configuration screen 2200 and return to the facility screen 2150 to select a configuration from a drop down menu and/or to textually enter the selection. In some cases, the toilet and/or hopper sink configuration screen 2200 may be used to directly select the configuration of a particular toilet and/or hopper sink. For example, the user may click, or otherwise select, the picture that most closely resembles the configuration (e.g., toilet and/or hopper sink material, trapway shape, etc.).

Similarly, an opening type may be selectable within column 2184, a size may be selectable within column 2186, and a toilet and/or hopper sink style may be selectable in column 2190. For example, the opening column 2184 may be used to define a shape of the trapway. The shape of the trapway may be defined as having zero corners, two corners or four corners. For example, a trapway having zero corners may have curved edges around the outer surface of the trapway. A trapway having two corners may include corners along each of two sides of an upper edge of the trapway. Similarly, a trapway having four corners may include corners along each of the two sides of the upper surface of the trapway, and corners along two sides of the lower surface of the trapway. Optionally, a trapway opening screen 2220 of FIG. 22B may appear when the opening field 2184 has been selected. For example, the opening screen may include a picture of a trapway having no corners, a second picture of a trapway have two corners, and a third picture of a trapway having four corners. As discussed above, the user may return to the facility screen 2150 to textually enter the configuration information, or may select the trapway configuration graphically, for example, selecting an image representing the opening type as presented in trapway opening screen 2220 of FIG. 22B.

Figure 22C:
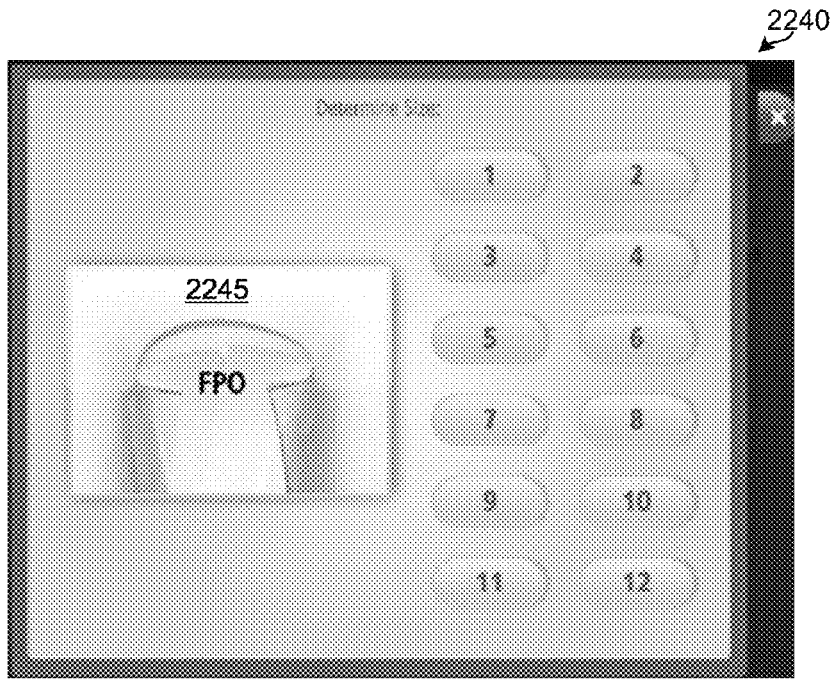
Figure 25A:
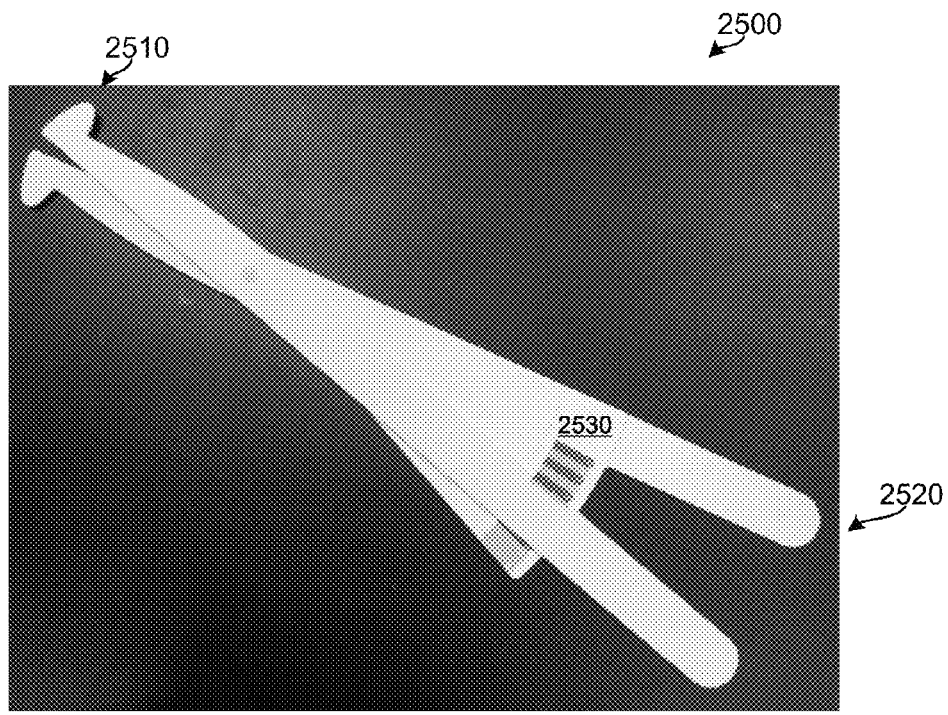
FIGS. 25A and B show different views of an illustrative trapway sizing tool in accordance with aspects of the illustrative embodiments.
Figure 25B:
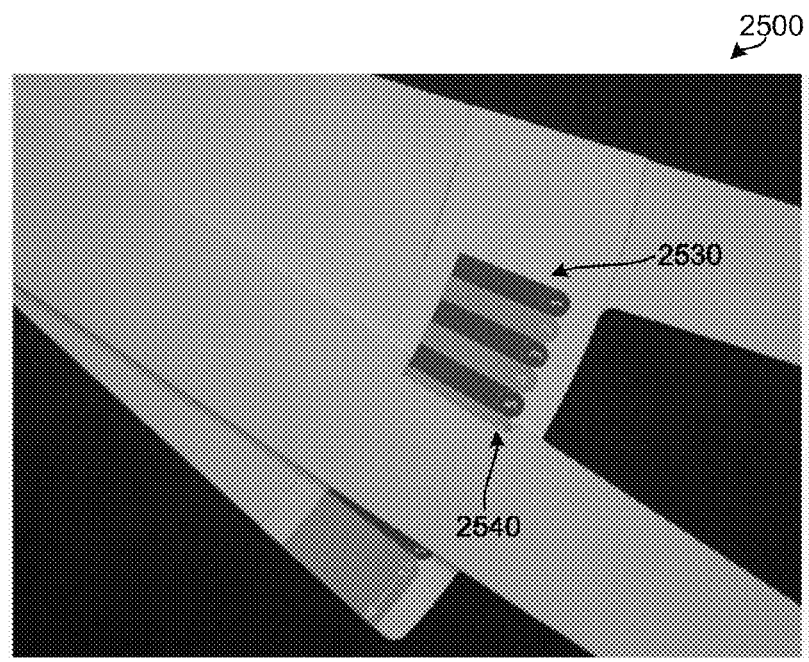

In some cases, the size of the trapway for each toilet and/or hopper sink configuration may be entered using a sizing screen 2240 of FIG. 22C. The sizing screen may present an image 2245 illustrating use of a trapway sizing tool 2500 of FIGS. 25A and 25B, when determining a size of the trapway opening. For example, the illustrative trapway sizing tool 2500 of FIGS. 25A and 25B may include a distal end 2510 and a proximal end 2520. The distal end 2510 may be placed near the opening of the trapway of a toilet and/or hopper sink, as shown in the image 2245 of FIG. 22C. When the outer edges of the distal end are near and/or engaged with the outer surface of the trapway opening, the size of the trapway opening may be reflected in a gauge 2530 of the trapway sizing tool 2500. The gauge 2530 may be configured to provide a relative measurement corresponding to a specified size of a particular trapping device.

For example, the illustrated gauge 2530 includes sections corresponding to a particular size range. For example, the gauge may have measurements between 1 and 12. When determining the size of the trapway, the size may be indicated using an indicator 2540. In the illustrated example, the measurement portion of the gauge 2530 may be included as a portion of a first handle of the trapway sizing tool 2500. The indicator 2540 may be included as a cut-away portion within a second handle of the trapway sizing tool 2500. When the trapway sizing tool 2500 is used within the trapway of the toilet and/or hopper sink as illustrated in the image 2245 sizing screen 2240, the trapway size may be read using the gauge 2530 and the indicator 2540. In some cases, the largest measurement may be configured as a catch-all for all trapways larger than a particular specified size. In other cases, the gauge 230 may be configured to provide an absolute measurement (e.g., inches, millimeters, etc.) of the trapway size. When determined, the size of the trapway may be entered via selections on the sizing screen 2240 and/or may be entered manually in the facility screen 2100. In some cases, one or more other sizing tools, such as the sizing tool 310 of FIG. 10, may optionally be used.

Figure 22D:
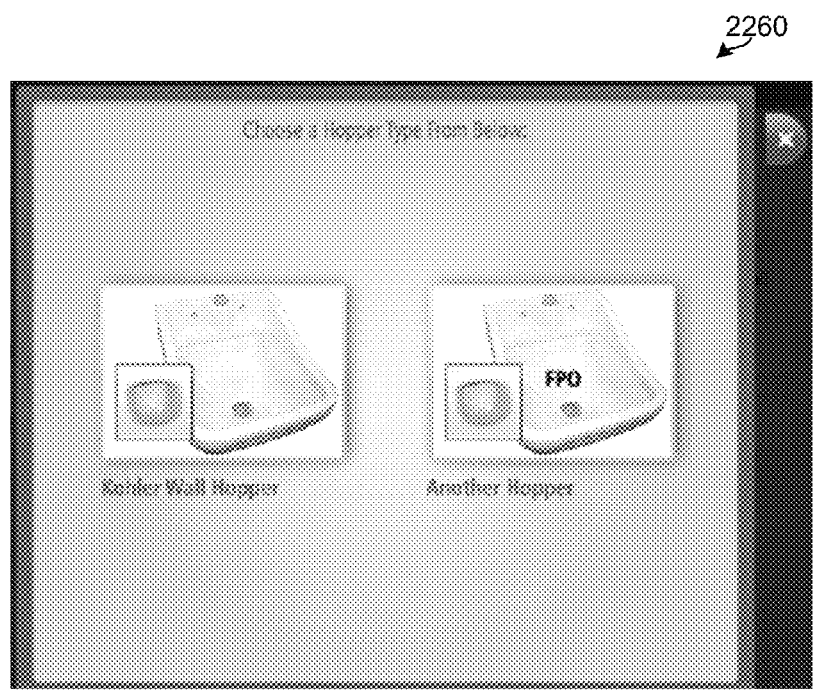

In some cases, the toilet may correspond to a clinical sink (e.g., a hopper or a hopper sink), such as the hopper sinks illustrated in the hopper sink screen 2260 of FIG. 22D. The hopper sinks may be used for rinsing of bedpans and/or soiled linen. As such, a tapping device installed in a trapway of the hopper sink may be useful in keeping non-dispersing cloths and/or other materials out of the sanitary sewage system of the facility. In these cases, a hopper sink may be specified using the hopper sink screen 2260. In such cases, the user may select a style and/or manufacturer of hopper sink from the selections offered on the hopper sink screen 2280. In cases when a hopper sink is not offered in hopper sink screen 2280, the user may enter the information manually and/or may attach an image of the hopper sink using the camera button 2140 in the same manner they size a toilet.

As discussed above and illustrated in FIGS. 21A and 21B, the camera button 2140 may be used to associate photographs with a particular toilet and/or hopper sink configuration. For example, when a user selects the camera button a dialog may appear providing a selection menu 2142. The selection menu 2142 may include selectable choices to allow a user to take new photographs, view existing photographs, import photographs and/or to cancel the operation. When a user elects to take a new photograph, the computer device 1800 may open a camera application that uses the camera 1850. In other cases, a user may be offered the opportunity to upload pictures from an external device, such as a camera and/or a memory device. In some cases, the trapping device sizing application 1712 may allow the user to transfer images to an external device, such as via the communication interface 1830 and/or the I/O 1840. In some cases, the facility screen 2100 may include an indicator 2144 that may indicate whether or not pictures are associated with a particular toilet and/or hopper sink configuration.

Figure 23:
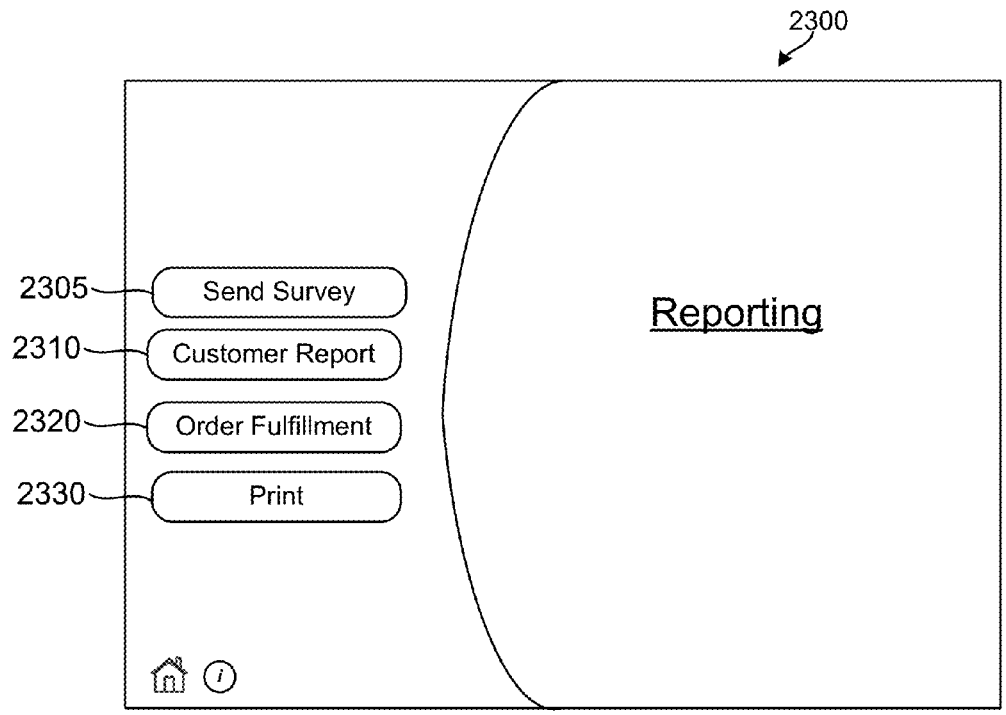

FIG. 23 shows an illustrative reporting screen 2300 of the trapping device sizing application 1712. The reporting screen 2300 may include one or more selectable options for the user. For example, the reporting screen may include a "send survey" button, a "customer report" button 2310, an "order fulfillment" button 2320, and/or a "print" button 2330. For example, once one or more trapping devices have been specified on the facility screen, the user (e.g., a sales person) may desire to send a report detailing a number of trapping devices to be installed at the facility. In some cases, the trapping device sizing application 1712 may access pricing information and/or delivery date information stored locally on the computer device 1710 and/or stored remotely such as in the data repository 1770. In some cases, the report may include a separate section for each unit (e.g., cardiology, ER, ICU, etc.) at the facility. For example, the unit sections may include the different toilet types, hopper sink types, along with associated room numbers and notes. Where available, the report may further include images taken with the camera 1850. In some cases, the reports may be viewed electronically on the computer device 1710. In other cases, the report may be delivered in an electric format and/or in a physical (e.g., printed) format. For example, the report may be electronically communicated via the network 1715 to the corresponding facility 1720 as an electronic document, spreadsheet and/or email.

When the order fulfillment button 2320 is selected, ordering information may be sent via the network 1715 to the supplier site 1720, 1730. For example, the ordering information may be sent in electronic form as an electronic document and/or spreadsheet. The spreadsheet may include the customer information (e.g., facility name, facility contact information, address, etc.), unit information and a number of trapping devices of each model number to be delivered. In some cases, the ordering information may include information confirming the order status as a valid order, such as by including a sales person's signature. Once an order has been verified, installation information may be generated and/or delivered to the facility 1720, 1730. For example, the installation information may include a verified order status, a number of trapping devices to be installed, and a listing of which model number of trapping device is to be installed in a particular room. The report may include the configuration information, model number(s) of different trapping devices, prices, delivery times, and the like.

Figure 24:
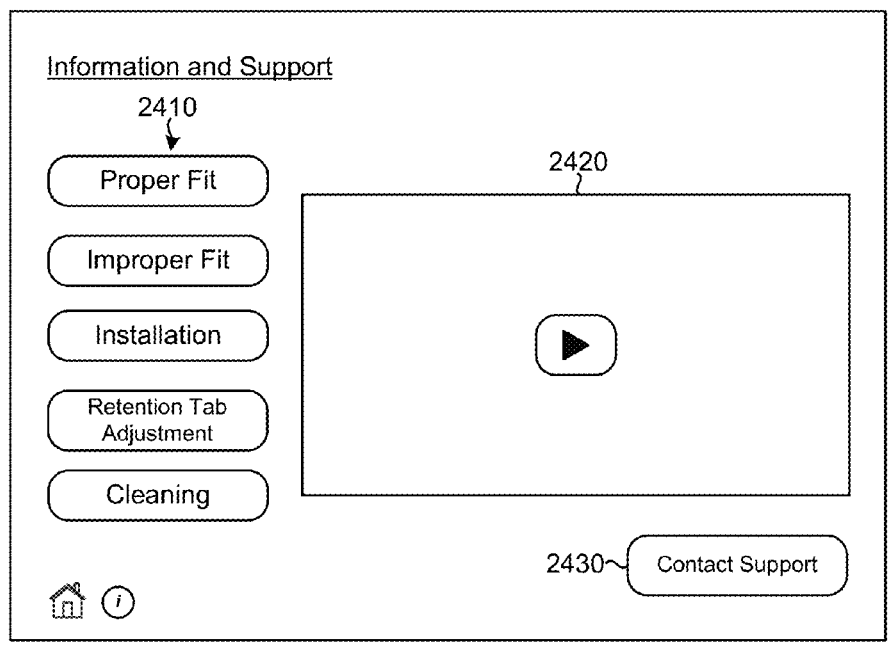

FIG. 24 shows an illustrative information and support screen 2400 of the trapping device sizing application 1712. The information and support screen 2400 may be configured to present information to a user about how to properly install, use and/or maintain a trapway trapping device. For example, the information and support screen may include one or more buttons 2410 that may then cause the trapping device sizing application 7412 to present instructions and/or best practice information to a user, such as by presenting a video in a video player 2420. Such videos may include videos that visually show a trapping device having a proper fit in a toilet and/or hopper sink trapway, a trapping device having an improper fit in a toilet and/or hopper sink trapway, and/or a method of cleaning non-dispersing cloths and/or other materials from the trapping device. In some cases, the videos may show installation instructions and/or adjustment instructions to a user. In some cases, the information and support screen 2400 may include contact information for a supplier of the trapping devices. For example, the information and support screen 2400 may include textual contact information (e.g., a contact name, a contact department, an address, a telephone number, an email address, an instant message address, etc.). In other cases, a support button 2430 may be used to open a second window that presents the contact information to the user. In some cases, the support button 2430 may allow a user to directly send a message (e.g., email message, text message, instant message, etc.) to a service and/or support group of the supplier.

Figure 26:
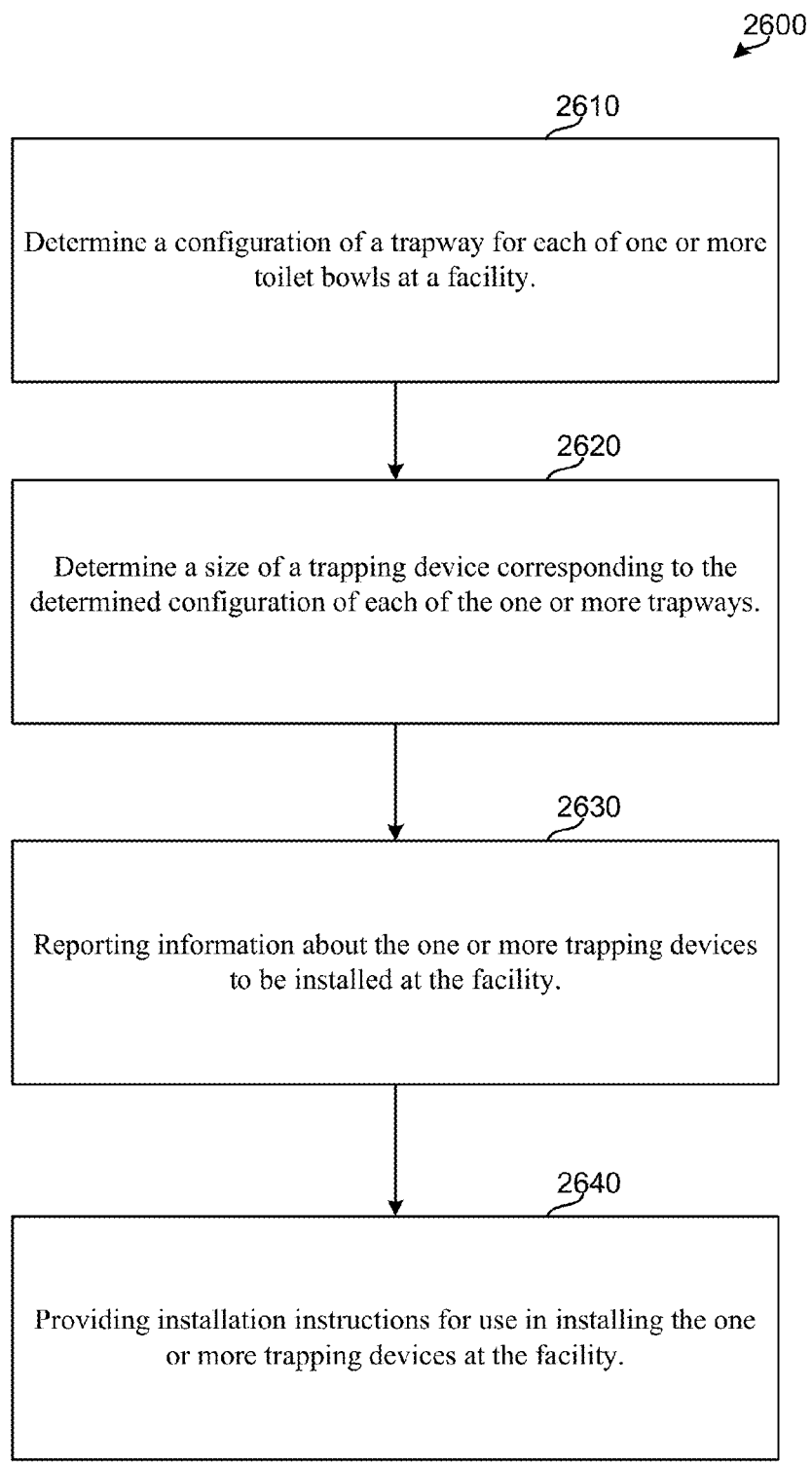
FIG. 26 shows a portion of an illustrative method for sizing a trapping device to fit in a trapway of a toilet in accordance with aspects of the illustrative embodiments.

FIG. 26 shows a portion of an illustrative method 2600 for sizing a trapping device to fit in a trapway of a toilet and/or hopper sink, wherein the trapping device is for trapping non-dispersing cloths and/or other materials in a toilet bowl and/or hopper sink. For example, at 2610 a computer device

1710 may be configured to determine a configuration of a trapway for each of one or more toilet bowls and/or hopper sinks at a facility. At 2620, the computer device may be configured to determine a size of a trapping device corresponding to the determined configuration of each of the one or more trapways. In some cases, the computer device 1710 may determine a size of the trapway for each of the one or more toilets and/or hopper sinks at the facility 1720, 1730. Once determined, the size of the trapway may be used to determine a model of trapping device that may provide a best fit for the trapway of a particular toilet and/or hopper sink. In some cases, the computer device 1710 may be configured to determine the configuration of a toilet and/or hopper sink by determining whether or not a jet-assist feature is present, determining a location of a jet in relation to the opening of the trapway, and/or determining a shape of the trapway opening. The toilet and/or hopper sink configuration information may be used by the computer device 1710 to a model of trapping device to use with a particular toilet and/or hopper sink or group of toilets and/or hopper sinks. In some cases, a model number may not correspond to a particular toilet and/or hopper sink configuration. In such cases, the computer device 1710 may be configured to receive a photograph of at least a portion of the toilet and/or hopper sink from a camera. The computer device may determine a trapping device configuration based, at least in part, on the toilet and/or hopper sink configuration information and the photograph of the toilet and/or hopper sink. In some cases, the computer device 1710 may communicate the configuration information and/or the photograph of the toilet and/or hopper sink to the supplier facility 1750 to be processed. In response, the computer device 1710 may receive information (e.g., a newly created model number) about a particular trapping device that may provide a best fit of the trapway.

In some cases, at 2630, the computer device 1710 may be configured to communicate a report detailing a number of trapping devices for use at the facility 1720, 1730 to the manufacturer. For example, the computer device may communicate a report, via the network 1715 to the supplier facility 1750. In some cases, the report may detail a total number of trapping devices to be installed at the facility. The report may be received at the server 1760 and/or stored in the data repository 1770 and may be used in an order fulfillment procedure. In some cases, a report may be prepared by the computer device 1710 and communicated to a customer contact at the facility 1720, 1730. This report may provide details about an order for one or more trapping devices to be installed at the facility 1720, 1730, including a number of trapping devices ordered, model numbers of the trapping devices ordered, a delivery date, a price per unit, a total price for the order, and the like. In some cases, the report may be used by the computer device 1710 to facilitate the installation of the trapping devices at the facility 1720, 1730. For example, the computer device 1710 may provide a listing of trapping devices to be installed in each of the units 1740 at the facility 1720, 1730 and/or a listing of tools required to install the trapping devices. In some cases, at 2640, the computer device 1710 may provide installation instructions to facilitate the installation of the trapping devices, which may be in the form of written instructions, audio instructions, and/or video instructions.

CONCLUSION

The present invention is disclosed above and in the accompanying drawings with reference to a variety of examples. The purpose served by the disclosure, however, is to provide an example of the various features and concepts related to the invention, not to limit the scope of the invention. One skilled in the relevant art will recognize that numerous variations and modifications may be made to the aspects described above without departing from the scope of the present invention, as defined by the appended claims.

We claim:

1. A method of sizing a plurality of trapping devices for trapping non-dispersing cloths in a toilet bowl comprising:
   providing, by a computer device local to a facility, a user interface screen comprising a plurality of fields identifying a location of each of a plurality of toilets within the facility and a configuration of each of the plurality of toilets, wherein the location of each of the plurality of toilets comprises a unit and a room and the configuration of a toilet bowl of each of the plurality of toilets comprises a trapway configuration and a toilet type;
   determining, by the computer device, a trapway configuration of the toilet bowl of each of the plurality of toilets at the facility based on information entered in each of the plurality of fields of the user interface screen; and
   displaying, by the computer device in a field of the user interface screen, a model number of a trapping device corresponding to the determined trapway configuration of the toilet bowl of each of the plurality of toilets.

2. The method of claim 1, comprising:
   determining, by the computer device, a size of a trapway of the toilet bowl of each of the plurality of toilets at the facility; and
   wherein determining the model number of the trapping device is based, at least in part, on the size of the trapway.

3. The method of claim 1, wherein determining the trapway configuration comprises determining whether a jet is present near the trapway.

4. The method of claim 1, wherein determining the trapway configuration comprises determining a material used in manufacturing the toilet bowl.

5. The method of claim 1, wherein determining the trapway configuration includes determining a shape of a trapway opening.

6. The method of claim 1, comprising determining a model of each of the plurality of toilets.

7. The method of claim 1, comprising displaying a photograph of at least a portion of each of the plurality of toilets; and
   determining, by the computer device, the trapway configuration based, at least in part, on the photograph.

8. The method of claim 1, comprising:
   communicating, via a network, a report detailing a total number of trapping devices for use at the facility to a manufacturer for preparing the trapping devices for installation.

9. The method of claim 1, comprising:
   reporting, via a network, a total number of trapping devices for use at the facility to a contact person at the facility.

10. The method of claim 9, comprising reporting, via the network, an order confirmation including information corresponding to a number of trapping devices for installation within each of the plurality of toilets within the facility.

11. The method of claim 1, comprising:
    generating, by the computer device, installation instructions for use by an installer when installing the trapping device in each of the plurality of toilets at the facility.

12. The method of claim 1, comprising:
presenting, by the computer device, at least one of an installation video, a video of a trapping device having a proper fit, a video of a trapping device having an improper fit, and a trapping device adjustment video.

13. An apparatus for use in sizing one or more trapping devices for use at a facility, wherein each trapping device is configured to trap non-dispersing cloths in a toilet bowl, the apparatus comprising:
one or more processors; and
one or more memory devices communicatively coupled to the one or more processors, the memory devices configured to store instructions, that when executed by the processor, cause the apparatus to:
determine, by a computer device, a configuration of a trapway for a toilet bowl of each of a plurality of toilets at a facility; and
determine, by the computer device, a size of a trapping device for each of the plurality of toilets at the facility based on a determined configuration of a trapway of each of the plurality of toilets.

14. The apparatus of claim 13, comprising:
a user interface, the user interface communicatively coupled to the one or more processors and the one or more memory devices, the user interface to receive and/or present information corresponding to the trapway of each of the plurality of toilets at the facility.

15. The apparatus of claim 14, wherein the user interface comprises a touch screen to present one or more user interface screens to a user, the user interface screens to solicit from a user, information corresponding to a toilet bowl of each of the plurality of toilets at the facility.

16. The apparatus of claim 13, wherein the one or more memory devices include instructions, that when executed by the processor, further cause the apparatus to generate a report including information about one or more trapping devices to be installed at a customer facility.

17. The apparatus of claim 16, comprising a communication interface communicatively coupled to the processor, the communication interface for communicating the report to a consumer at the customer facility.

18. The apparatus of claim 17, wherein the communication interface for communicating the report to a supplier facility.

19. A system to determine a size of a trapping device for trapping non-dispersing cloths in a toilet at a facility, the system including:
a computing device including a processor and a memory communicatively coupled to the processor, the memory storing instructions, that when executed by the processor, cause the computing device to:
receive, via a user interface screen, information corresponding to a plurality of toilets at the facility, the information including at least a trapway configuration for each of the plurality of toilets; and
determine a model number of a trapping device for use with each of the plurality of toilets; and
a communication device coupled to the computing device, the communication device configured to communicate information about each trapping device to at least one of a customer at the facility and a user at a supplier of the trapping device.

20. The system of claim 19, comprising a manufacturer computing system communicatively coupled to the computing device via a network, wherein the manufacturing computing system generates installation instructions describing an installation of the trapping device in a toilet based on the communicated information about each trapping device; and
wherein the installation instructions include instructions corresponding to a compression system configured to hold the trapping device in a rounded semi-compressed configuration and then release the trapping device to a rounded uncompressed configuration when installed in a toilet bowl such that the trapping device fits tightly within the toilet bowl.

* * * * *